(12) United States Patent
Liu et al.

(10) Patent No.: US 10,325,046 B2
(45) Date of Patent: Jun. 18, 2019

(54) FORMAL METHOD FOR CLOCK TREE ANALYSIS AND OPTIMIZATION

(71) Applicant: Synopsys, Inc., Mountain View, CA (US)

(72) Inventors: Lingyi Liu, Pleasanton, CA (US); Ngai Ngai William Hung, San Jose, CA (US); Sitanshu Seth, Santa Clara, CA (US); Leonid Alexander Broukhis, Sunnyvale, CA (US); Dhiraj Goswami, Wilsonville, OR (US)

(73) Assignee: SYNOPSYS, INC., Mountain View, CA (US)

( * ) Notice: Subject to any disclaimer, the term of this patent is extended or adjusted under 35 U.S.C. 154(b) by 0 days.

(21) Appl. No.: 15/705,784

(22) Filed: Sep. 15, 2017

(65) Prior Publication Data

US 2018/0082004 A1    Mar. 22, 2018

Related U.S. Application Data

(60) Provisional application No. 62/397,324, filed on Sep. 20, 2016.

(51) Int. Cl.
*G06F 9/455* (2018.01)
*G06F 17/50* (2006.01)

(52) U.S. Cl.
CPC ........ *G06F 17/5031* (2013.01); *G06F 17/504* (2013.01); *G06F 17/5027* (2013.01); *G06F 17/5054* (2013.01); *G06F 2217/62* (2013.01)

(58) Field of Classification Search
USPC ........................................ 716/103, 104, 108
See application file for complete search history.

(56) References Cited

U.S. PATENT DOCUMENTS

| 5,517,506 A | 5/1996 | Underwood et al. |
| 5,649,176 A | 7/1997 | Selvidge et al. |
| 5,801,955 A | 9/1998 | Burgun et al. |
| 7,082,582 B1* | 7/2006 | Borkovic .............. G06F 17/505 716/103 |
| 7,116,740 B1 | 10/2006 | Martinez |

(Continued)

OTHER PUBLICATIONS

WIPO Application No. PCT/US2017/052150, PCT International Search Report and Written Opinion of the International Searching Authority dated Nov. 28, 2017.

*Primary Examiner* — Brian Ngo
(74) *Attorney, Agent, or Firm* — Alston & Bird LLP

(57) ABSTRACT

Configuring a hardware verification system includes receiving first data representing a first integrated circuit design configured to operate via a first clock signal derived from a second clock signal and a third signal generated by the second clock signal. The computer transforms the first data into second data representing a second design that includes functionality of the first design. The transformation replaces the first clock signal with the second clock signal. A first Boolean function is defined by first and second values of the third signal corresponding to a first transition of the second clock signal being in a same direction as a transition of the first clock signal. A second Boolean function is defined by the first and second values of the third signal corresponding to a second transition of the second clock signal being in a direction opposite to the associated transition of the first clock signal.

20 Claims, 10 Drawing Sheets

(56) References Cited

U.S. PATENT DOCUMENTS

| | | | |
|---|---|---|---|
| 7,424,689 B1 * | 9/2008 | Yuan | G06F 17/5054 |
| | | | 716/104 |
| 7,500,205 B2 | 3/2009 | Paul et al. | |
| 9,543,959 B1 * | 1/2017 | Carmean | H03K 19/195 |
| 2005/0125754 A1 | 6/2005 | Schubert et al. | |
| 2009/0187875 A1 | 7/2009 | Smith et al. | |
| 2009/0217068 A1 * | 8/2009 | Fernsler, Jr. | G06F 1/3203 |
| | | | 713/322 |
| 2015/0161313 A1 * | 6/2015 | Drasny | G06F 17/5031 |
| | | | 716/103 |
| 2015/0294054 A1 | 10/2015 | Mitra et al. | |
| 2016/0314239 A1 | 10/2016 | Rabinovitch et al. | |
| 2017/0109466 A1 | 4/2017 | Guerin et al. | |
| 2017/0294900 A1 * | 10/2017 | Fradet | H03K 3/0375 |

* cited by examiner

FORMAL METHOD FOR CLOCK TREE ANALYSIS AND OPTIMIZATION

CROSS-REFERENCES TO RELATED APPLICATIONS

This application claims priority, under 35 U.S.C. § 119(e), from U.S. Provisional Application No. 62/397,324, filed on Sep. 20, 2016, entitled "FORMAL METHOD FOR CLOCK TREE ANALYSIS AND OPTIMIZATION", the contents of all of which is incorporated herein by reference in its entirety.

BACKGROUND

The present disclosure relates generally to testing a circuit design, and more specifically to testing such circuit using a programmable emulation tool having improved performance.

Integrated circuit (IC) designers commonly describe their designs in hardware description language (HDL) such as Verilog, VHDL, SystemC, and the like. In IC design, hardware emulation may refer to the process of replicating behavior of one or more pieces of hardware such as a circuit design, hereinafter also referred to as a design under test (DUT), with another piece of hardware, such as a special-purpose emulation system. An emulation model is usually generated in accordance with a HDL source code representing the design under test. The emulation model is compiled into a format used to program the emulation system that may include one or more field programmable gate array (FPGA). Thereby, the DUT is mapped by the compiler into the FPGA of the emulator system. Running the emulation system that has been programmed with the emulation model enables debugging and functional verification of the DUT. Overall progress of the emulation is usually controlled by a master clock signal generated on the emulator hardware.

A DUT, such as for example an application specific IC (ASIC), may include a complex clock structure called a clock tree, hereinafter also referred to as a "clock cone," that may use dedicated, low-skew, signal routing resources in the ASIC chip to prevent the problem of clock skew in the physical implementation of the ASIC. In contrast, an FPGA may include a limited number of low-skew signal paths that are available for mapping portions of the clock tree into the FPGA. When low-skew signal paths are used up in an FPGA during the mapping procedure, emulation compilers have introduced additional latches to the original DUT to provide delays to avoid timing violations caused by excessive clock skew in the FPGA. However, such additional latches consume more FPGA resources, which increases the area of the FPGA that is needed to implement the emulation of the DUT, which in-turn may increase emulator complexity and/or reduce speed performance of the emulator system.

With recent technology advances, circuit designs have used more and more complex clock trees. Therefore, there is a need for reducing the use of low-skew signal resources in FPGA when efficiently mapping a complex clock tree of a DUT to a hardware emulation system without having to introduce additional delay circuits.

SUMMARY

According to one embodiment of the present invention, a computer-implemented method for configuring a hardware verification system is presented. The method includes receiving, by the computer, a first data representative of a first design of an integrated circuit configured to operate by a first clock signal derived from a second clock signal and a third signal generated in accordance with the second clock signal, when the computer is invoked to configure the verification system. The method further includes transforming, using the computer, the first data into a second data representative of a second design that includes functionality of the first design. The transformation replaces the first clock signal with the second clock signal in accordance with the following features. A first Boolean function is defined by first and second values of the third signal corresponding to a first transition of the second clock signal being in a same direction as an associated transition of the first clock signal. A second Boolean function is defined by the first and second values of the third signal corresponding to a second transition of the second clock signal being in a direction opposite to that of the associated transition of the first clock signal. A constraint is defining the first and second values of the third signal. There is a Boolean satisfiability of the first and second Boolean functions.

According to one embodiment, the first Boolean function is further defined in the first design by the following features. The first transition of the second clock signal is characterized by a first direction. The associated transition of the first clock signal is characterized by the first direction. The first value of the third signal is defined before the first transition of the second clock signal. The second value of the third signal is defined after the first transition of the second clock signal.

According to one embodiment, the second Boolean function is further defined in the first design by the following features. The second transition of the second clock signal is characterized by a first direction. The associated transition of the first clock signal is characterized by a second direction different from the first direction. The first value of the third signal is defined before the first transition of the second clock signal. The second value of the third signal is defined after the first transition of the second clock signal.

According to one embodiment, the Boolean satisfiability further includes determining that the first Boolean function is satisfiable and the second Boolean function is unsatisfiable. According to one embodiment, the Boolean satisfiability further includes determining that the first Boolean function is unsatisfiable and the second Boolean function is satisfiable.

According to one embodiment, the first design further includes a first sequential element configured to be clocked in accordance with the first signal. The first signal is derived from the second signal and the third signal. The third signal is generated by a second sequential element configured to be clocked in accordance with the second signal.

According to one embodiment, the transformation further includes replacing a first sequential element configured to be clocked in accordance with the first signal in the first design with a second sequential element configured in the second design to be clocked in accordance with a rising transition of the second clock signal, and enabled in accordance with a combinatorial circuit that implements the first Boolean function after determining that the first Boolean function is satisfiable and the second Boolean function is unsatisfiable. According to one embodiment, the second sequential element is further configured in the second design to be enabled in accordance with a combinatorial circuit that implements the first Boolean function after determining that the first Boolean function is unsatisfiable and the second Boolean function is satisfiable. According to one embodiment, the second sequential element is a flip-flop. The transforming further includes coupling the second signal to a clock input terminal of the flip-flop, and coupling an output of the combinatorial circuit to an enable input terminal of the flip-flop.

According to one embodiment, the transformation further includes replacing a first sequential element configured to be clocked in accordance with the first signal in the first design with a second sequential element configured in the second design to be clocked in accordance with a rising transition of the second clock signal. The second sequential element is further configured in the second design to be enabled in accordance with a combinatorial circuit that implements the second Boolean function after determining that the first Boolean function is unsatisfiable and the second Boolean function is satisfiable.

According to one embodiment of the present invention, a system for configuring a hardware verification system is presented. The system is configured to receive a first data representative of a first design of an integrated circuit configured to operate by a first clock signal derived from a second clock signal and a third signal generated in accordance with the second signal, when the computer is invoked to configure the verification system. The system is further configured to transform the first data into a second data representative of a second design that includes functionality of the first design. The transformation replaces the first signal with the second signal in accordance with the following features. A first Boolean function is defined by first and second values of the third signal corresponding to a first transition of the second clock signal being in a same direction as an associated transition of the first clock signal. A second Boolean function is defined by the first and second values of the third signal corresponding to a transition of the second clock signal being in a direction opposite to that of an associated transition of the first clock signal. A constraint is defining the first and second values of the third signal. There is a Boolean satisfiability of the first and second Boolean functions.

According to one embodiment, the transformation is further configured to replace a first sequential element configured to be clocked in accordance with the first signal in the first design with a second sequential element configured in the second design to be clocked in accordance with a rising transition of the second clock signal, and enabled in accordance with a combinatorial circuit that implements the first Boolean function after determining that the first Boolean function is satisfiable and the second Boolean function is unsatisfiable.

According to one embodiment, the second sequential element is a flip-flop. The transformation is further configured to couple the second signal to a clock input terminal of the flip-flop, and couple an output of the combinatorial circuit to an enable input terminal of the flip-flop.

According to one embodiment, the transformation is further configured to replace a first sequential element configured to be clocked in accordance with the first signal in the first design with a second sequential element configured in the second design to be clocked in accordance with a rising transition of the second clock signal. The second sequential element is further configured in the second design to be enabled in accordance with a combinatorial circuit that implements the second Boolean function after determining that the first Boolean function is unsatisfiable and the second Boolean function is satisfiable.

A better understanding of the nature and advantages of the embodiments of the present invention may be gained with reference to the following detailed description and the accompanying drawings.

DETAILED DESCRIPTION

The term "programmable device" is used herein to refer to an integrated circuit designed to be configured and/or reconfigured after manufacturing. Programmable devices may include programmable processors, such as field programmable gate arrays (FPGAs), configurable hardware logic (CHL), and/or any other type programmable devices. Configuration of the programmable device is generally specified using a computer code or data such as a hardware description language (HDL), such as for example Verilog, VHDL, or the like. A programmable device may include an array of programmable logic blocks and a hierarchy of reconfigurable interconnects that allow the programmable logic blocks to be coupled to each other according to the descriptions in the HDL code. Each of the programmable logic blocks can be configured to perform complex combinational functions, or merely simple logic gates, such as AND, and XOR logic blocks. In most FPGAs, logic blocks also include memory elements, which may be simple latches, flip-flops, hereinafter also referred to as "flops," or more complex blocks of memory. Depending on the length of the interconnections between different logic blocks, signals may arrive at input terminals of the logic blocks at different times.

Figure 1:
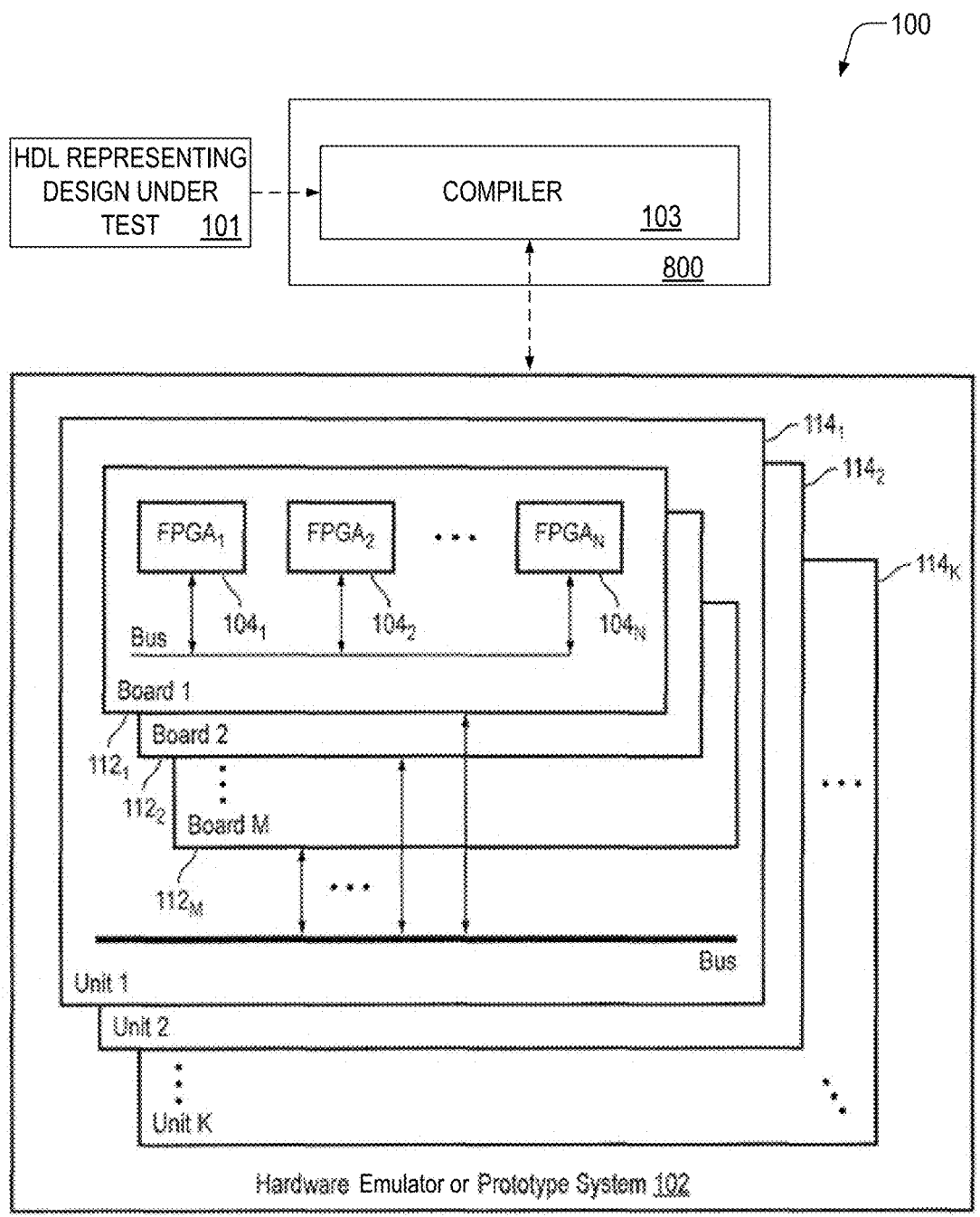
FIG. 1 depicts an exemplary high level block diagram of a hardware emulation or prototype system, in accordance with one embodiment of the present invention.

Hardware emulation and/or prototyping systems may utilize one or more programmable devices. FIG. 1 is an exemplary high-level block diagram of a hardware verification system 100, in accordance with one embodiment of the present invention. Hardware verification system 100 may be used to verify, test or debug a circuit design. Hardware verification system 100 may include a hardware emulator and/or prototype system 102, hereinafter also referred to as a hardware verification system, and a computer system 800 that is described in reference to FIG. 8. As depicted in FIG. 1, hardware emulator and/or prototype system 102 may be coupled to computer system 800, which may include a compiler 103 module that may receive a hardware description language code representing an initial circuit design under test 101, hereinafter also referred to as "design under test," "circuit design," or "initial design."

Compiler 103 may include a multitude of various software modules that may or may not include a dedicated compiler module, however for the purposes of this description may be referred to simply as "compiler." Compiler 103 may transform, change, reconfigure, add new functions to, and/or control the timing of design under test 101 that facilitate verification, emulation, or prototyping of design under test 101. Further, compiler 103 may compile the code or data representing design under test 101 and any associated changes into a binary image used to program the hardware primitives disposed in hardware emulator and/or prototype system 102. Thereby, the logical functions and timing of design under test 101, hereinafter also referred to as "circuit design," that may ultimately be implemented by hardware in an integrated circuit chip may instead be first implemented in hardware emulator and/or prototype system 102. Among other advantages, verification of the design in hardware may be accomplished at much higher speed than by software verification alone.

Hardware emulator and/or prototype system 102 may include a multitude of programmable processors such as FPGAs $104_1$ through $104_N$, and other blocks (not shown), such as memories, input/output devices, other processors, and the like. The hardware emulation and/or prototype system receives a circuit design, and programs the programmable processors to verify behavior of the circuit design. Hardware emulator and/or prototype system 102 may include a primary or master system clock from which a number of other clock signals can be generated.

Programmable processors FPGAs $104_1$-$104_N$ may be placed into one or more hardware boards $112_1$ through $112_M$. Multiple of such boards can be placed into a hardware unit, e.g. $114_1$. The boards within a unit may be connected using the backplane of the unit or any other types of connections. In addition, multiple hardware units (e.g., $114_1$ through $114_K$) can be connected to each other by cables or any other means to form a multi-unit system. In general, the hardware emulator or prototype system 102 may be made of a single board, a single unit with multiple boards, or multiple units without departing from the teachings of the present disclosure.

When the initial design 101 represents an ASIC or other complex IC, clock skew may be a problem because it is common to find a larger number of derived clocks in initial design 101 than the number of available low-skew interconnect paths in hardware emulator or prototype system 102. In accordance with embodiments of the present invention, a formal technique is presented for clock analysis of initial design 101 and optimization, hereinafter also referred to as "transformation," that exploit circuit constraints—either inherently in the circuits or explicitly specified by users. Initial design 101 may include hidden constraints such that certain logic values will never occur on certain signals.

Further, the transformation preserves the functionality of the untransformed initial design 101 in the transformed design, while reducing the number of derived clocks in the transformed design in accordance with the constraints. The transformation is accomplished using compiler 103 before mapping or programming the transformed circuit design into hardware emulator or prototype system 102. Therefore, the transformation may reduce the number of low-skew high-speed interconnect resources required to map initial design 101 into hardware emulator or prototype system 102.

Reducing the number of derived clocks in hardware emulator or prototype system 102 enables compiler 103 to allocate the low-skew, high speed routing resources on FPGA 104 to the remaining primary clock signals in the transformed design instead of adding delay circuits that take additional FPGA resources and may slow down how hardware emulator or prototype system 102 runs. As a result, FPGA-based emulation for ASIC or other complex IC designs may run faster while utilizing the FPGA resources more efficiently.

The transformation may reduce the number of clock signals by moving the derived clock logic from the clock (CK) pin of sequential elements, such as flip-flops (FD), latches (LD), and/or block random access memory (BRAM), to the chip enable (CE) and/or gate enable (GE) pin of sequential elements and use the primary clock to drive the sequential elements instead of the derived clock, which is eliminated in the transformed design. Derived clocks may include gated clocks, generated clocks, and the like, that are characterized by being derived from a primary clock. In this context, a gated clock may denote a derived clock that is produced by a combinational circuit driven by a primary clock, and a generated clock may denote a derived clock that is produced by a sequential circuit driven by a primary clock.

Figure 2A:
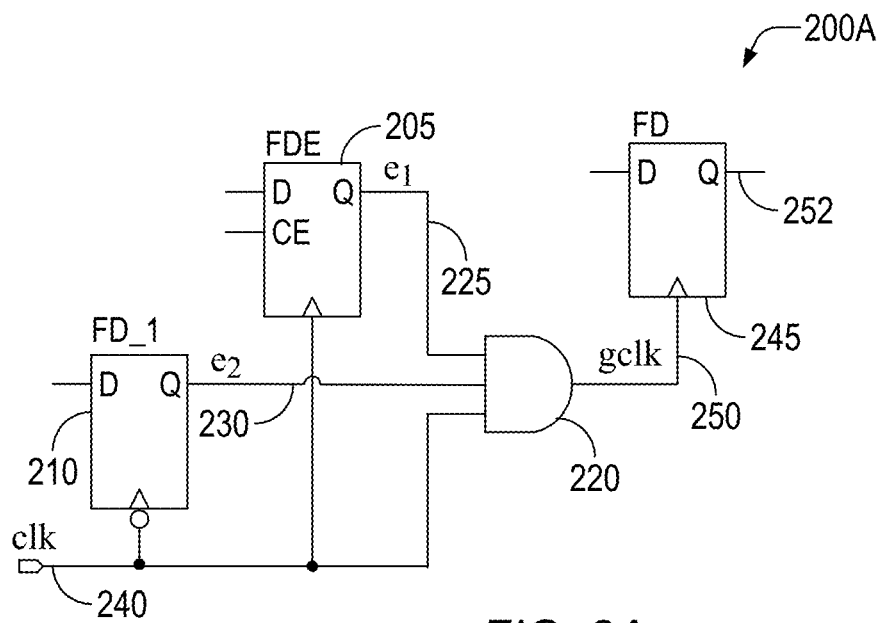
FIG. 2A depicts data representing an exemplary schematic of a circuit portion of the initial design depicted in FIG. 1 before transformation, that may be used by embodiments of the present invention.

FIG. 2A depicts data representing an exemplary schematic of a circuit portion 200A of initial design 101 depicted in FIG. 1 before transformation, that may be used by embodiments of the present invention. Circuit portion 200A of initial design 101 includes a flip flop FDE 205, a flip flop FD_1 210, a logical "AND" gate 220, and a flip flop FD 245. Flip flop FDE 205 is clocked by the positive going transition of clock signal clk 240. A Q output of flip flop FDE 205 drives a signal $e_1$ 225 with a logical value present on a D input signal of flip flop FDE 205 at the positive going transition of clock signal clk 240 when the value of a CE signal input of flip flop FDE 205 is a logical high or a "one." A Q output of flip flop FD_1 210 drives a signal $e_2$ 230 with a logical value present on a D input signal of flip flop FD_1 210 at the negative going transition of clock signal clk 240.

"AND" gate 220 receives three inputs, which are clock signal clk 240, signal $e_1$ 225, and signal $e_2$ 230. "AND" gate 220 drives a derived clock signal gclk 250 with a logical value representing the logical "AND" function of the logical values present on clock signal clk 240, signal $e_1$ 225, and signal $e_2$ 230. A Q output of flip flop FD 245 drives a signal Q 252 with a logical value present on a D input signal of flip flop FD 245 at the positive going transition of derived clock signal gclk 250.

Flip flop FDE 205, flip flop FD_1 210, logical "AND" gate 220, clock signal clk 240, signal $e_1$ 225, signal $e_2$ 230, and derived clock signal gclk 250 may form a portion of a clock tree, hereinafter also referred to as a "clock cone," of the initial design 101. Clock signals may generally be characterized as primary clocks and derived clocks that are derived from primary clocks. Derived clock signal gclk 250 may be characterized as a derived clock signal that is derived, in-part, from clock signal clk 240, which may be characterized as a primary clock signal.

Figure 2B:
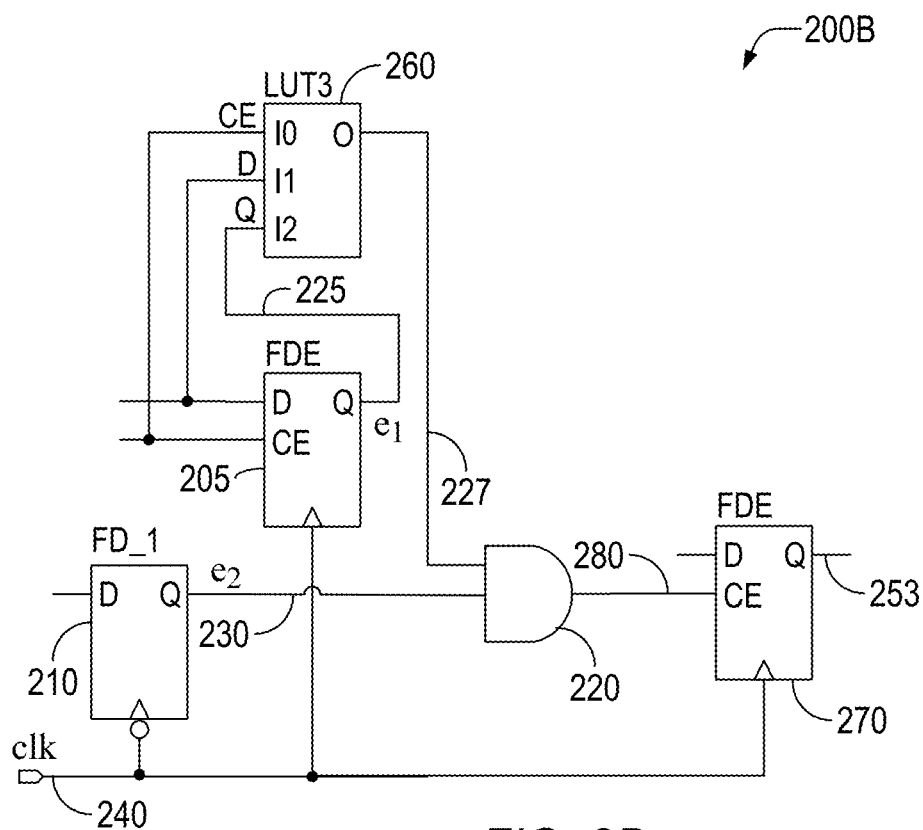
FIG. 2B depicts data representing an exemplary schematic of a circuit portion of a transformed design that includes functionality of the circuit portion depicted in FIG. 2A, in accordance with one embodiment of the present invention.

FIG. 2B depicts data representing an exemplary schematic of a circuit portion 200B of a transformed design that includes functionality of the circuit portion depicted in FIG. 2A, in accordance with one embodiment of the present invention. Referring simultaneously to FIGS. 2A and 2B, circuit portion 200B includes the same elements and function of circuit portion 200A of initial design 101 with the following exceptions. It is desired to transform circuit portion 200A of initial design 101 so as to eliminate the derived clock signal, derived clock signal gclk 250, to reduce the number of derived clock signals in initial design 101 before programming the data representing initial design 101 into hardware emulator and/or prototype system 102.

Circuit portion 200B of the transformed design includes a look up table (LUT) LUT3 260 and a flip flop FDE 270. The transformation includes replacing flip flop FD 245, which does not include a CE signal input in the untransformed initial design 101, with a flip flop FDE 270, which includes a CE signal input 280 in the transformed design. In another embodiment, if the flip-flop receiving the derived clock in initial design 101 already includes a CE signal input, then the transformation may not need to replace that flip-flop during the transformation.

The transformation further includes disconnecting signal $e_1$ 225 from the input of logical "AND" gate 220 in initial design 101 and instead connecting signal $e_1$ 225 from the Q output of flip flop FDE 205 to an I2 input of look up table LUT3 260. The transformation further includes connecting the D and CE signal inputs of flip flop FDE 205 to respective I1 and I0 inputs of look up table LUT3 260. In the transformed circuit, an output O of look up table LUT3 260 drives a signal 227, which in-turn drives one input of logical "AND" gate 220 and the clock signal clk 240 has been disconnected from the input of logical "AND" gate 220. The functionality of look up table LUT3 260 and the functionality of circuit portion 200B, which preserves a logical functionality of circuit portion 200A, will be described in greater detail below.

Thereby, the derived clock logic circuit of circuit portion 200A that generated the derived clock signal, e.g. derived clock signal gclk 250, is moved from the clock pin of a sequential circuit, e.g. flip flop FD 245, to the enable pin, e.g. the CE signal input of flip flop FDE 270. A Q output of flip flop FDE 270 drives a signal Q 253 with a logical value present on a D input signal of flip flop FDE 270 at the positive going transition of the primary clock, e.g. clock signal clk 240. Accordingly, the functionality of signal Q 252 in circuit portion 200A is preserved at signal Q 253 in circuit portion 200B. Circuit portion 200B of the transformed design thus reduces the number of low-skew type interconnect resources that are needed in FPGA 104 of hardware emulator and/or prototype system 102.

Figure 3:
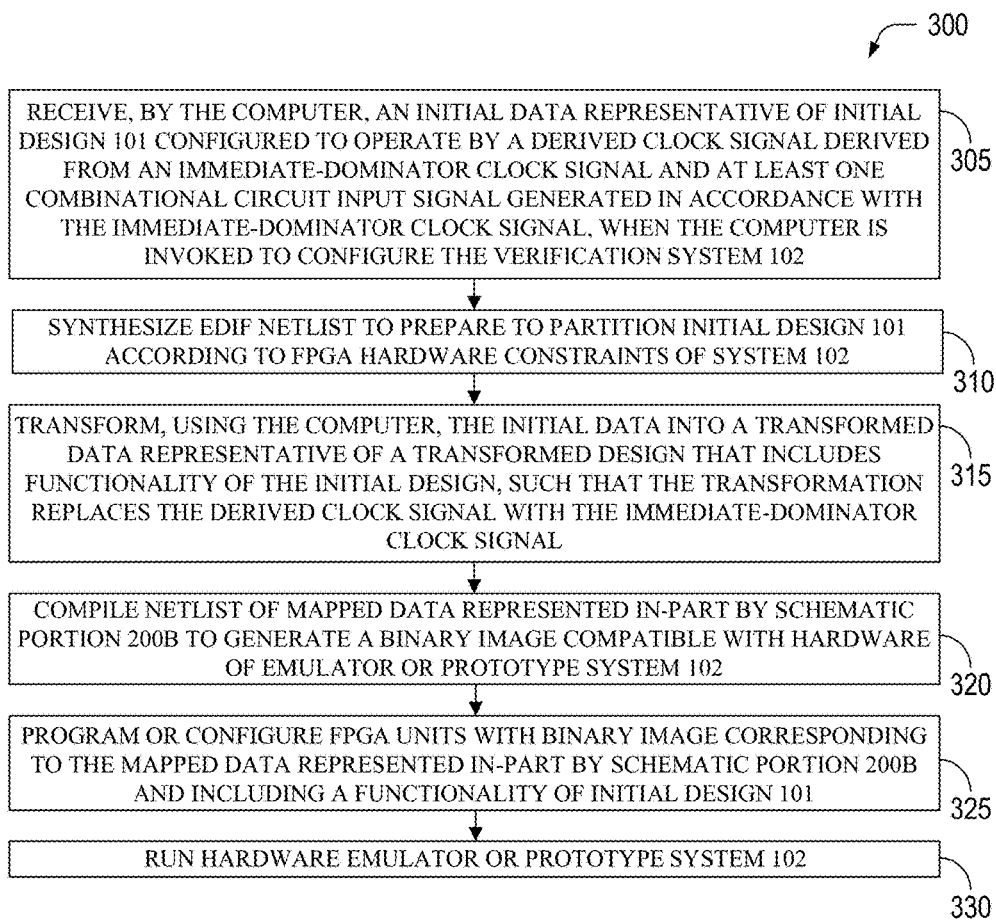
FIG. 3 depicts a simple exemplary flowchart for transforming the circuit portion of the initial design depicted in FIG. 2A and configuring the hardware emulator or prototype system depicted in FIG. 1, in accordance with one embodiment of the present invention.

FIG. 3 depicts a simple exemplary flowchart 300 for transforming circuit portion 200A of initial design 101 depicted in FIG. 2A and configuring hardware emulator and/or prototype system 102 depicted in FIG. 1, in accordance with one embodiment of the present invention. Referring simultaneously to FIGS. 1, 2A-2B, and 3, the transformation replaces the derived clock signal, e.g. derived clock signal gclk 250, with the primary clock signal, e.g. clock signal clk 240. Flowchart 300 includes receiving 305, by computer 1400, an initial data, e.g. circuit portion 200A, representative of initial design 101 configured to operate by a derived clock signal, e.g. derived clock signal gclk 250, which may be derived from an immediate dominator type primary clock signal, e.g. clock signal clk 240, and at least one combinational circuit input signal, e.g. signal $e_1$ 225, signal $e_2$ 230, generated in accordance with the immediate dominator clock signal, e.g. clock signal clk 240, when the computer is invoked to configure the verification system, e.g. hardware emulator and/or prototype system 102. An immediate dominator clock signal is a type of primary clock signal that will be described in greater detail below.

Then, compiler 103 synthesizes 310 an EDIF netlist to prepare to partition initial design 101 according to FPGA 104 hardware constraints of hardware emulator or prototype system 102. As is frequently the case, the partitioning may be required if the data representing initial design 101 is too much to map into the hardware of a single FPGA 104.

Compiler 103 then transforms 315 the initial data representing initial design 101, such as circuit portion 200A, into a transformed data representative of a transformed design, such as circuit portion 200B, that includes functionality of initial design 101, such that the transformation replaces the derived clock signal, e.g. derived clock signal gclk 250, with the immediate dominator clock signal, e.g. clock signal clk 240.

Figure 4:
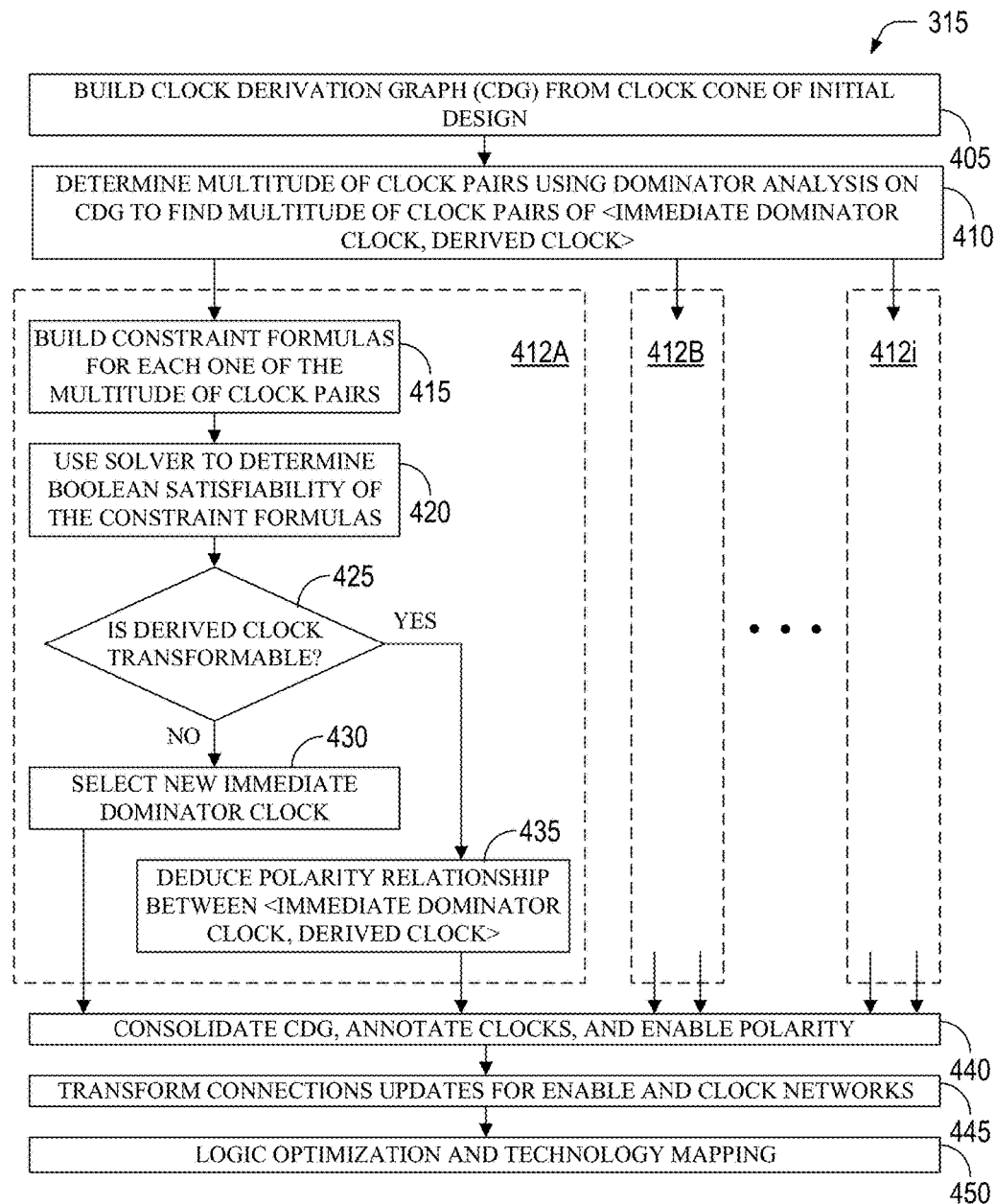
FIG. 4 depicts a simple exemplary flowchart for the step of transforming the initial data depicted in FIG. 3, in accordance with one embodiment of the present invention.

FIG. 4 depicts a simple exemplary flowchart 315 for the step of transforming the initial data depicted in FIG. 3, in accordance with one embodiment of the present invention. Compiler 103 builds 405 or constructs a clock derivation graph (CDG) from a clock cone of initial design 101. Potential loops in the CDG are detected and broken such that the built CDG is loop-free.

Figure 5:
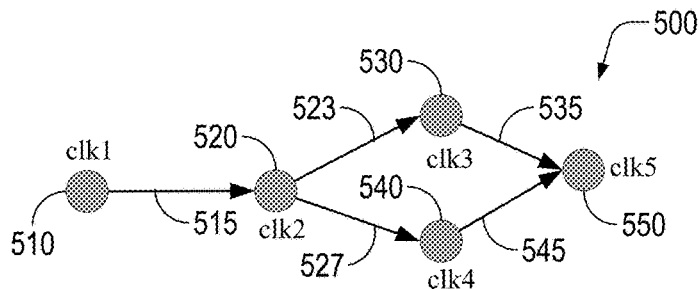
FIG. 5 depicts data representing a first exemplary clock derivation graph (CDG), in accordance with one embodiment of the present invention.

FIG. 5 depicts data representing a first exemplary clock derivation graph (CDG) 500, in accordance with one embodiment of the present invention. A CDG is used with complex clock cones to identify the primary clock that is an immediate dominator clock signal. For a hypothetical clock cone, CDG 500 includes a multitude of vertices 510, 520, 530, 540, 550 associated respectively with a multitude of clocks clk1, clk2, clk3, clk4, clk5. CDG 500 further includes a multitude of edges 515, 523, 527, 535, 545 that represent the relationships between a multitude of associated pairs of clocks <clk1, clk2>, <clk2, clk3>, <clk2, clk4>, <clk3, clk5>, <clk4, clk5> respectively. The arrows on each of the multitude of edges 515, 523, 527, 535, 545 point from a vertex associated with a first clock toward a vertex associated with a second clock that is driven in accordance with the first clock for each clock pair. For example, edge 523 is associated with vertices (520, 530), which are associated respectively with clock pair <clk2, clk3> where clk3 is derived from clk2.

Clk1 may be characterized as a root clock of the clock tree and is also characterized as a primary clock. Clk2 may be characterized as a dominator clock signal type of primary clock signal because every path along the multitude of edges from vertex 510 associated with root clock clk1 must pass through vertex 520 associated with Clk2. For example, CDG 500 indicates that clk3 and clk4 are not dominator clock signals for clk5 because vertex 530 associated with clk3 has one path from vertex 510 to vertex 550, while vertex 540 associated with clk4 has another path from vertex 510 to vertex 550. However, clk1 and clk2 are both dominator clock signals for clk5. Any clock signal other than the root clock clk1 may be selected as a derived clock with an associated dominator clock signal.

A dominator clock signal may be characterized as an immediate dominator clock signal when the vertex associated with that dominator clock signal is closest to the vertex associated with the selected derived clock signal in a CDG for any clock pair <immediate dominator clock, derived clock>. For example, if clk5 is selected as a derived clock then vertex 520 associated with clk2 is closer to vertex 550 associated with clk5 than vertex 510 associated with clk1. Therefore, clk2 is characterized as the immediate dominator clock signal for selected derived clk5 in clock pair <clk2, clk5>. Similarly, if derived clk3 is selected, then clk2 is characterized as the immediate dominator clock signal for selected derived clk3 in clock pair <clk2, clk3>.

It is noted that the immediate dominator clock of any clock pair <immediate dominator clock, derived clock> may also be the derived clock of a different clock pair. For example, the immediate dominator clock of clock pair <clk2, clk5> is clk2, which may also be the derived clock of a different clock pair, <clk1, clk2>, because clk2 is derived from clk1. In other words, when clk2 is selected as a derived clock, then clk1 may be characterized as the immediate dominator clock signal for selected derived clk2 in clock pair <clk1, clk2>, however clk2 may also be characterized as the immediate dominator clock signal for the different clock pair <clk2, clk5>.

Figure 6:
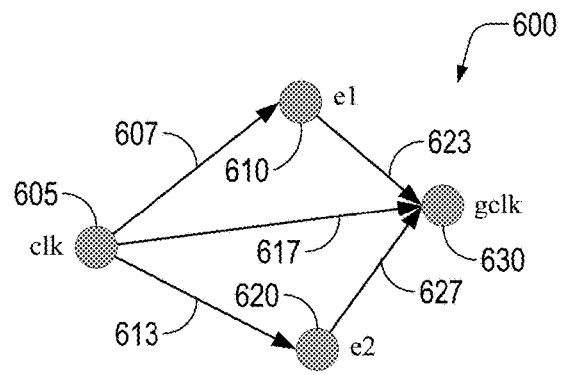
FIG. 6 depicts data representing a second exemplary CDG associated with circuit portion 200A of the initial design depicted in FIG. 2A, in accordance with one embodiment of the present invention.

FIG. 6 depicts data representing a second exemplary CDG 600 associated with circuit portion 200A of the initial design depicted in FIG. 2A, in accordance with one embodiment of the present invention. Referring simultaneously to FIGS. 2A and 6, CDG 600 includes a multitude of vertices 605, 610, 620, 630 associated respectively with a multitude of clocks clk, e1, e2, gclk of circuit portion 200A. CDG 600 further includes a multitude of edges 607, 613, 617, 623, 627 that represent the relationships between a multitude of associated pairs of clocks <clk, e1>, <clk, e2>, <clk, gclk>, <e1, gclk>, <e2, gclk> respectively. The arrows on each of the multitude of edges 607, 613, 617, 623, 627 point from a vertex associated with a first clock toward a vertex associated with a second clock that is driven in accordance with the first clock for each clock pair. When derived clock signal gclk 250 is selected as a derived clock, then clock signal clk 240 is the immediate dominator clock signal for derived clock signal gclk 250.

Referring simultaneously to FIGS. 4, 5 and 6, it is understood that CDG 600 may be associated with only a small portion of the entire clock cone of initial design 101, which may be much more complex than CDG 600 and which may include many more vertices and edges than CDG 600. When compiler 103 builds 405 the clock derivation graph (CDG) from a clock cone of initial design 101 the entire clock cone of initial design 101 is built that may include CDG 600 associated with circuit portion 200A.

Then compiler 103 determines 410 a multitude of clock pairs using the immediate dominator definition and analysis described above on the entire CDG of initial design 101 to find a multitude of clock pairs where each clock pair includes <immediate dominator clock, derived clock>. The following steps of exemplary flowchart 315 for the step of transforming the initial data are done as a multitude of parallel process steps, 412A, 412B through 412i, where i represents the total number of clock pairs of the multitude of clock pairs <immediate dominator clock, derived clock>. In other words, parallel process steps, 412A, 412B through 412i are done for each one of the multitude of clock pairs, <immediate dominator clock, derived clock>. Parallel process step 412A may include building 415 a constraint formula for a selected one of the multitude of clock pairs, e.g. a selected <immediate dominator clock, derived clock>, such as for respective clock pairs <clock signal clk 240, derived clock signal gclk 250> or <immediate dominator clock signal clk 740, derived clock signal gclk 750>, which may be selected for the embodiment associated with parallel process step 412A to be described below.

Figure 7:
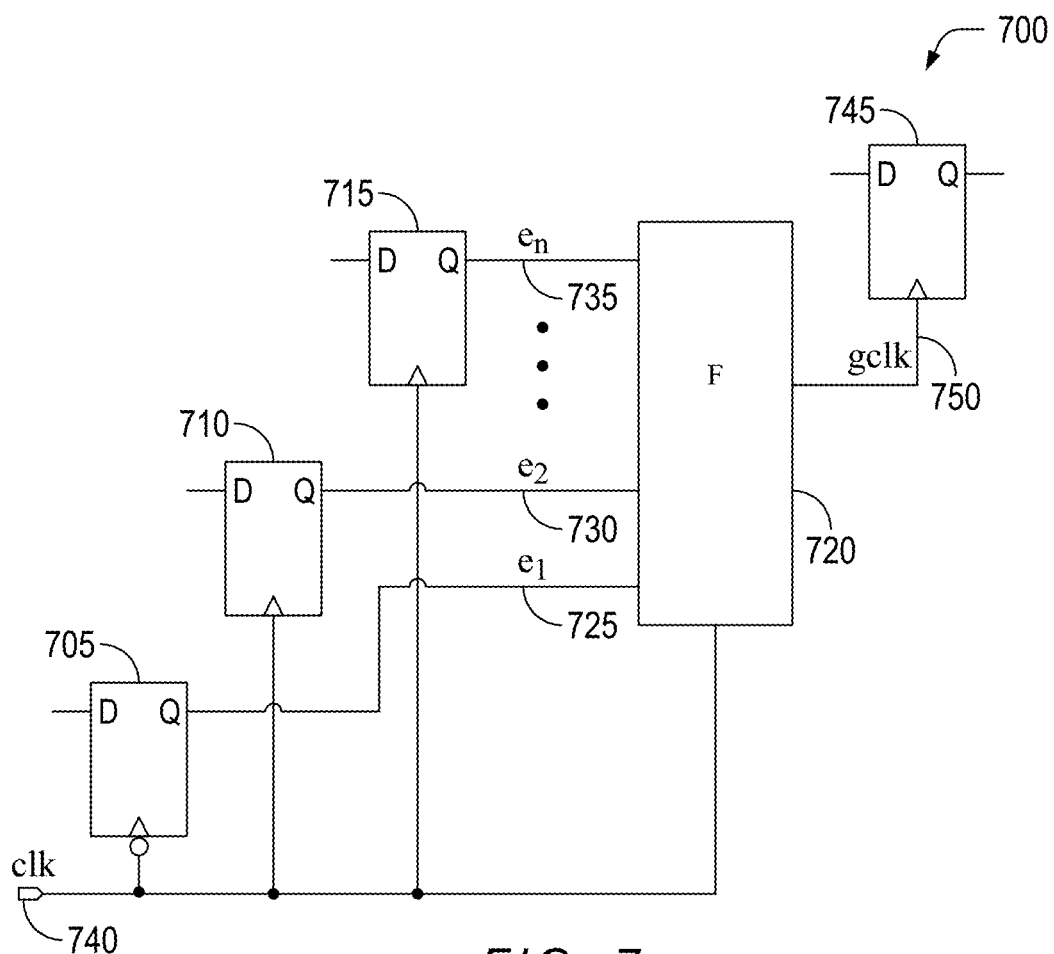
FIG. 7 depicts data representing an exemplary schematic of a generalized derived clock function that may be used in the step to build a constraint formula depicted in FIG. 4, in accordance with one embodiment of the present invention.

FIG. 7 depicts data representing an exemplary schematic of a generalized derived clock function 700 that may be used in the step to build 415 a constraint formula depicted in FIG. 4, in accordance with one embodiment of the present invention. Generalized derived clock function 700 may include a multitude of sequential circuits 705, 710 through 715, and a combinational circuit function F 720 that generates a derived clock signal gclk 750 that clocks a sequential circuit 745. Multitude of sequential circuits 705, 710 through 715 may be clocked by an immediate dominator clock signal clk 740 and may generate respective output signals $e_1$ 725, $e_2$ 730 through $e_n$ 735, where n represents a number of sequential circuits 705, 710 through 715 in a selected portion of a clock tree that is associated with a selected clock pair.

Output signals $e_1$ 725, $e_2$ 730 through $e_n$ 735, and immediate dominator clock signal clk 740 are inputs to combinational circuit function F 720. Let F be a combinational Boolean function represented by combinational circuit function F 720 and given the selected clock pair <immediate dominator clock, derived clock> is represented by <clk, gclk> then;

$$F(clk, e_1, e_2, \ldots, e_n) = gclk. \qquad \text{eq. 1)}$$

In one embodiment, multitude of sequential circuits 705, 710 through 715 may each be a flip-flop. In one embodiment, sequential circuit 745 may be a flip-flop. In one embodiment, sequential circuit 745 may be clocked by a rising or positive transition of derived clock signal gclk 750. In one embodiment, at least one sequential circuit 705 may be clocked by a falling or negative transition of immediate dominator clock signal clk 740. In one embodiment, at least one sequential circuit 710, 715 may be a flip-flop that is clocked by a rising or positive transition of immediate dominator clock signal clk 740.

Although, the invention has been described with reference to an exemplary polarity of clock transition that clocks each of the multitude of sequential circuits 705, 710 through 715, and sequential circuit 745 by way of an example, it is understood that the invention is not limited by the polarity of clock transition. In this context, "clocking" a sequential circuit means that a negative or falling transition of the value of the clock signal from a logical "1"="high" to logical "0"="low," or a positive or rising transition from a logical "0" to logical "1," causes the sequential circuit to be evaluated or toggled, when all enable signals to the sequential circuit allow the evaluation. The effect of polarity of clock transition will be analyzed and described in greater detail below.

In one embodiment, multitude of sequential circuits 705, 710 through 715 may not each be clocked by the same immediate dominator clock signal clk 740. In one embodiment, one of the multitude of sequential circuits, 705, 710 through 715 may be driven by a clock signal that is divided from the immediate dominator clock signal clk 740, for example using a clock divider circuit. In one embodiment, one of the multitude of sequential circuits 705, 710 through 715 may be derived from the same immediate dominator clock signal clk 740. However, each of the multitude of sequential circuits 705, 710 through 715 may not be driven from another independent clock signal. In other words, there should be only one fastest immediate dominator clock signal clk in F. Further, if clk is not used in the function F, then gclk may be a generated clock.

In one embodiment where sequential circuit 745 drives an input to the function F thereby creating a feedback loop in the CDG, loop breaking may be used in the CDG transform the initial design 101 so as to remove the loop. In one embodiment, a clock signal within a feedback loop in the CDG may not be transformed.

Immediate dominator clock signal clk 740 may be the fastest clock in the portion of the clock cone associated with selected clock pair <clk, gclk>. Any activity in that portion of the clock cone may be triggered by a rising transition or falling transition of the immediate dominator clock signal clk 740. There exists an assignment to all output signals $e_1$, $e_2$, $e_3$, ..., $e_n$ under which the transition direction, e.g. rising transition and falling transition, on immediate dominator clock signal clk 740 may lead to either a rising transition or falling transition on derived clock signal gclk 750. Notice that output signals $e_1$, $e_2$, $e_3$, ..., $e_n$ may also change due to the transition direction of immediate dominator clock signal clk 740. In one embodiment, the output signals $e_1$, $e_2$, $e_3$, ..., $e_n$ may also be driven by a clock signal that is not immediate dominator clock signal clk 740, such as for example, a clock signal that is divided from immediate dominator clock signal clk 740. Then, the relationship between the clock signal driving the output signals $e_1$, $e_2$, $e_3$, ..., $e_n$ and the immediate dominator clock signal may be recursively included.

To characterize the assignment, let output signals $e_1^-$, $e_2^-$, $e_3^-$, ..., $e_n^-$ denote the associated values of output signals $e_1$, $e_2$, $e_3$, ..., $e_n$ before the transition or edge of immediate dominator clock signal clk 740. To further characterize the assignment, let output signals $e_1^+$, $e_2^+$, $e_3^+$, ..., $e_n^+$ denote the associated values of output signals $e_1$, $e_2$, $e_3$, ..., $e_n$ after the transition or edge of immediate dominator clock signal clk 740. The constraints among the values of the output signals $e_1^-$, $e_2^-$, $e_3^-$, ..., $e_n^-$, $e_1^+$, $e_2^+$, $e_3^+$, ..., $e_n^+$ may be characterized as the transition relation TR.

The transition relation TR mainly constrains the $e^-$, $e^+$, and immediate dominator clock signal clk 740 relationships. Further, let the value of immediate dominator clock signal clk 740 before the transition or edge of immediate dominator clock signal clk 740 be $clk^-$ and the value of immediate dominator clock signal clk 740 after the transition or edge of immediate dominator clock signal clk 740 be $clk^+$. For the example, when sequential circuit 710 such as a flip flop FD is clocked using the positive or rising transition of the immediate dominator clock signal clk 740, then a description of a constraint when there is an inactive transition, e.g. a negative or falling transition of immediate dominator clock signal clk 740 may be formally written as;

$$(clk^-=1) \rightarrow (clk^+=0) \rightarrow (e^-=e^+).\qquad\text{eq. 2}$$

For another constraint example, a description of a constraint when there is no transition of the immediate dominator clock signal clk 740 may be formally written as;

$$(clk^-=clk^+) \rightarrow (e^-=e^+).\qquad\text{eq. 3}$$

Note that if one of the multitude of sequential circuits, 705, 710 through 715 is not directly driven by immediate dominator clock signal clk 740, the corresponding "e" variable may be used to replace the "clk" variable. Since the immediate dominator clock signal clk 740 may have a rising transition or a falling transition, there are two respective transition relations, $TR_\uparrow$ and $TR_\downarrow$.

Figure 8A:
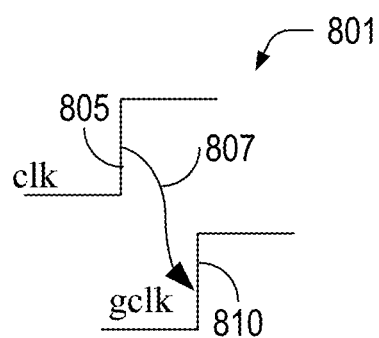
FIG. 8A depicts a first transition case associated with the schematic of the generalized derived clock function depicted in FIG. 7, in accordance with one embodiment of the present invention.

FIG. 8A depicts a first transition case 801 associated with schematic of the generalized derived clock function 700 depicted in FIG. 7, in accordance with one embodiment of the present invention. Referring simultaneously to FIGS. 8A and 7, first transition case 801 is characterized by a rising or positive transition 805 of immediate dominator clock signal clk 740 that derives 807 a rising or positive transition 810 of derived clock signal gclk 750. For first transition case 801 the constraint relationship may be formally written by substituting the values associated with clk and gclk before and after the transition into equation 1 yielding Boolean function;

$$(F(0,e_1^-,e_2^-,e_3^-,\ldots,e_n^-)=0) \wedge$$

$$(F(1,e_1^+,e_2^+,e_3^+,\ldots,e_n^+)=1) \wedge$$

$$TR_\downarrow(e_1^-,e_2^-,e_3^-,\ldots,e_n^-,e_1^+,e_2^+,e_3^+,\ldots,e_n^+).\qquad\text{eq. 4}$$

Figure 8B:
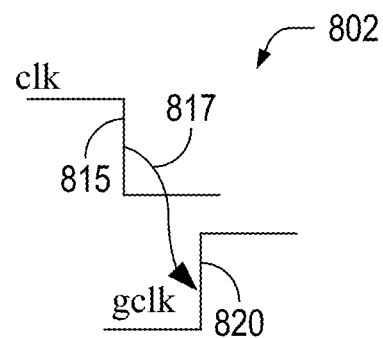
FIG. 8B depicts a second transition case associated with the schematic of the generalized derived clock function depicted in FIG. 7, in accordance with one embodiment of the present invention.

FIG. 8B depicts a second transition case 802 associated with schematic of the generalized derived clock function 700 depicted in FIG. 7, in accordance with one embodiment of the present invention. Referring simultaneously to FIGS. 8B and 7, second transition case 802 is characterized by a falling or negative transition 815 of immediate dominator clock signal clk 740 that derives 817 a rising or positive transition 820 of derived clock signal gclk 750. For second transition case 802 the constraint relationship may be formally written by substituting the values associated with clk and gclk before and after the transition into equation 1 yielding Boolean function;

$$(F(1,e_1^-,e_2^-,e_3^{31}, \ldots ,e_n^-)=0) \wedge$$

$$(F(0,e_1^+,e_2^+,e_3^+, \ldots ,e_n^+)=1) \wedge$$

$$TR_\downarrow(e_1^-,e_2^-,e_3^-, \ldots ,e_n^-,e_1^+,e_2^+,e_3^+, \ldots ,e_n^+). \qquad \text{eq. 5}$$

Figure 8C:
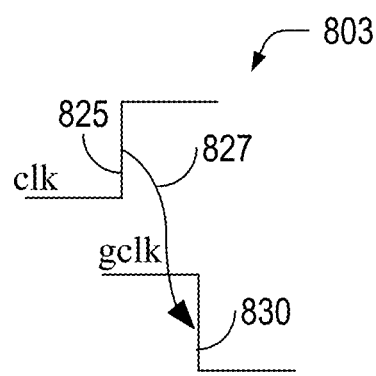
FIG. 8C depicts a third transition case associated with the schematic of the generalized derived clock function depicted in FIG. 7, in accordance with one embodiment of the present invention.

FIG. 8C depicts a third transition case 803 associated with the schematic of the generalized derived clock function depicted in FIG. 7, in accordance with one embodiment of the present invention. Referring simultaneously to FIGS. 8C and 7, third transition case 803 is characterized by a rising or positive transition 825 of immediate dominator clock signal clk 740 that derives 827 a falling or negative transition 830 of derived clock signal gclk 750. For third transition case 803 the constraint relationship may be formally written by substituting the values associated with clk and gclk before and after the transition into equation 1 yielding Boolean function;

$$(F(0,e_1^-,e_2^-,e_3^-, \ldots ,e_n^-)=1) \wedge$$

$$(F(1,e_1^+,e_2^+,e_3^+, \ldots ,e_n^+)=0) \wedge$$

$$TR_\uparrow(e_1^-,e_2^-,e_3^-, \ldots ,e_n^-,e_1^+,e_2^+,e_3^+, \ldots ,e_n^+). \qquad \text{eq. 6}$$

Figure 8D:
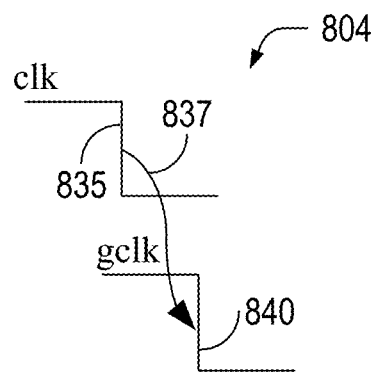
FIG. 8D depicts a fourth transition case associated with the schematic of the generalized derived clock function depicted in FIG. 7, in accordance with one embodiment of the present invention.

FIG. 8D depicts a fourth transition case 804 associated with the schematic of the generalized derived clock function depicted in FIG. 7, in accordance with one embodiment of the present invention. Referring simultaneously to FIGS. 8D and 7, fourth transition case 804 is characterized by a falling or negative transition 835 of immediate dominator clock signal clk 740 that derives 837 a falling or negative transition 840 of derived clock signal gclk 750. For fourth transition case 804 the constraint relationship may be formally written by substituting the values associated with clk and gclk before and after the transition into equation 1 yielding Boolean function;

$$(F(1,e_1^-,e_2^-,e_3^-, \ldots ,e_n^-)=1) \wedge$$

$$(F(0,e_1^+,e_2^+,e_3^+, \ldots ,e_n^+)=0) \wedge$$

$$TR_\downarrow(e_1^-,e_2^-,e_3^-, \ldots ,e_n^-,e_1^+,e_2^+,e_3^+, \ldots ,e_n^+). \qquad \text{eq. 7}$$

Referring simultaneously to FIGS. 2A, 7, and 8A-8B, it is understood that flip flop FDE 205, flip flop FD_1 210, logical "AND" gate 220, and flip flop FD 245 of circuit portion 200A may be respectively associated with sequential circuit 705, sequential circuit 710, combinational circuit function F 720, and sequential circuit 745 of generalized derived clock function 700. Further, it is understood that signal $e_1$ 225, signal $e_2$ 230, clock signal clk 240, and derived clock signal gclk 250 of circuit portion 200A may be respectively associated with signal $e_2$ 730, signal $e_1$ 725, immediate dominator clock signal clk 740, and derived clock signal gclk 750. Accordingly for circuit portion 200A, signal $e_1$ 225, signal $e_2$ 230, clock signal clk 240, and derived clock signal gclk 250 may be substituted in equation 1 to yield the combinational Boolean function represented by;

$$clk \ \& \ e_1 \ \& \ e_2 = gclk \qquad \text{eq. 8}$$

Figure 9:
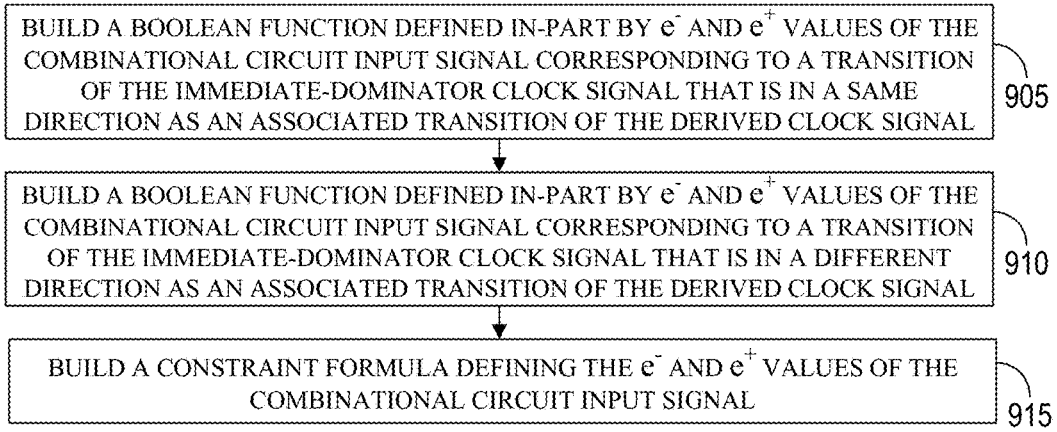
FIG. 9 depicts a simple exemplary flowchart for the step of building constraint formulas depicted in FIG. 4, in accordance with one embodiment of the present invention.

FIG. 9 depicts a simple exemplary flowchart 415 for the step of building constraint formulas depicted in FIG. 4, in accordance with one embodiment of the present invention. Referring simultaneously to FIGS. 7, 8A-8D, and 9, flowchart 415 for the step of building constraint formulas includes building 905 a Boolean function defined in-part by $e^-$ and $e^+$ values of the combinational circuit function F 720 input signal corresponding to a transition of immediate dominator clock signal clk 740 that is in a same direction as an associated transition of derived clock signal gclk 750. In one embodiment, this Boolean function may include the Boolean functions described above for transition case 801 or transition case 804 depending on whether sequential circuit 745 is respectively clocked using a rising transition or a falling transition of derived clock signal gclk 750.

Referring simultaneously to FIGS. 2A, 7, 8A-8B, and 9, it is understood that since flip flop FD 245 is clocked by the positive or rising transition of derived clock signal gclk 250, then building 905 a Boolean function associated with transition case 801 and Boolean equation 4 are applied for circuit portion 200A to provide;

$$(F(0,e_1^-,e_2^-)=0) \wedge$$

$$(F(1,e_1^+,e_2^+)=1) \wedge$$

$$TR_\uparrow(e_1^-,e_2^-,e_1^+,e_2^+). \qquad \text{eq. 9}$$

Further, it is understood that since flip flop FD_1 210 is clocked at the negative going transition of clock signal clk 240, then at the positive going transition of clock signal clk 240 flip flop FD_1 210 is not clocked so that $e_2$ does not change value during transition case 801. Therefore a constraint for $e_2$ exists and may be written as $(e_2^-=e_2^+)$. Accordingly, substituting equation 8 into equation 9 yields;

$$((0 \ \& \ e_1^{31} \ \& \ e_2^-)=0) \wedge$$

$$((1 \ \& \ e_1^+ \& \ e_2^+)=1) \wedge$$

$$(e_2^-=e_2^+) \qquad \text{eq. 10}$$

Flowchart 415 for the step of building constraint formulas further includes building 910 a Boolean function defined in-part by $e^-$ and $e^+$ values of the combinational circuit function F 720 input signal corresponding to a transition of immediate dominator clock signal clk 740 that is in a different direction as an associated transition of derived clock signal gclk 750. In one embodiment, this Boolean function may include the Boolean functions described above for transition case 802 or transition case 803 depending on whether sequential circuit 745 is respectively clocked using a rising transition or a falling transition of derived clock signal gclk 750.

Since flip flop FD 245 is clocked by the positive or rising transition of derived clock signal gclk 250 then building 910 a Boolean function is associated with transition case 802 with associated respective constraint equation 5 need also be considered. Applying Boolean equation 5 for circuit portion 200A provides;

$$(F(1,e_1^-,e_2^-)=0) \wedge$$

$$(F(0,e_1^+,e_2^+)=1) \wedge$$

$$TR_\downarrow(e_1^-,e_2^-,e_1^+,e_2^+). \qquad \text{eq. 11}$$

Further, it is understood that since flip flop FDE 205 is clocked at the positive going transition of clock signal clk 240, then during transition case 802 at the negative going transition of clock signal clk 240 flip flop FDE 205 is not clocked so that $e_1$ does not change value. Therefore a constraint for $e_1$ exists and may be written as $(e_1^-=e_1^+)$. Accordingly, substituting equation 8 into equation 11 yields;

$$((1 \ \& \ e_1^- \& \ e_2^-)=0) \wedge$$

$$((0 \ \& \ e_1^+ \& \ e_2^+)=1) \wedge$$

$$(e_1^-=e_1^+) \qquad \text{eq. 12}$$

Flowchart 415 for the step of building constraint formulas further includes building 915 a constraint formula defining the $e^-$ and $e^+$ values of the combinational circuit function F 720 input signal. Such constraints have been described above including functions for $TR_\uparrow$ and $TR_\downarrow$ associated respectively with $(e_2^-=e_2^+)$ and $(e_1^-=e_1^+)$ for circuit portion 200A for example.

Referring to FIGS. 2A, 4, 7, and 8A-8D, parallel process step 412A may further include using a solver to determine 420 Boolean satisfiability of the constraint formulas described above. Recall, there are four transition cases 801, 802, 803, 804 that may be considered. In one embodiment, each of the four transition cases 801, 802, 803, 804 may be separately considered for determining 420 Boolean satisfiability. Table 1 below depicts the results of determining 420 Boolean satisfiability for derived clock signal gclk 250 in circuit portion 200A.

TABLE 1

| Case 801 | SAT |
| Case 802 | UNSAT |
| Case 803 | UNSAT |
| Case 804 | SAT |

Compiler 103 or other Boolean solver program linked to compiler 103 determines separately whether each transition case 801, 802, 803, 804 is satisfiable (SAT) or unsatisfiable (UNSAT). The satisfiable value assignments of the constraints are not considered because the logic of "F" may be duplicated to create the clock tree transformation result described in greater detail below. Theoretically, more constraints, e.g. more UNSAT, produce better derived clock transformation, e.g. fewer remaining derived clocks in the transformed design.

In one embodiment, derived clock signal gclk 750 may be driving a multitude of sequential circuits that may include sequential circuit 745, some of which are clocked by a rising transition of derived clock signal gclk 750, while others are clocked by a falling transition of derived clock signal gclk 750. For each sequential circuit driven by derived clock signal gclk 750, depending on whether the sequential circuit is clocked using a rising transition or a falling transition of derived clock signal gclk 750, only two out of the four transition cases 801, 802, 803, 804 and their associated SAT/UNSAT results from table 1 need be considered during the transformation described in greater detail below. For the examples depicted in FIGS. 2A and 7, derived clock signal gclk 250 or derived clock signal gclk 750 respectively clocks flip flop FD 245 or sequential circuit 745 using a rising transition—then only transition case 801 and transition case 802 with associated respective constraint equations 4 and 5 need be considered for transformation as shown in table 2 below.

TABLE 2

| Transition Case 801 | Transition Case 802 | Result |
| --- | --- | --- |
| SAT | UNSAT | Positive Polarity |
| UNSAT | SAT | Negative Polarity |
| SAT | SAT | Cannot optimize |
| UNSAT | UNSAT | Stuck clock |

If both transition cases 801, 802 are SAT, then the derived clock signal will not be able to be transformed. If both transition cases 801, 802 are UNSAT, there may be a problem with the initial design 101 that should be considered for correction by other standard means to fix a probable stuck clock, and the derived clock signal may or may not be transformed until the stuck clock problem is fixed. If one of the two transition cases 801, 802 is SAT and the other is UNSAT, then the derived clock signal is transformable, such as indicated for the positive and negative polarity results in the top two rows of table 2, as is in this embodiment for derived clock signal gclk 250 or derived clock signal gclk 750.

Next, if 425 the selected derived clock signal is transformable, then compiler 103 deduces a polarity relationship result between the selected clock pair <immediate dominator clock, derived clock>, e.g. <clock signal clk 240, derived clock signal gclk 250> or <immediate dominator clock signal clk 740, derived clock signal gclk 750>. In other words, when the other selected clock pairs <immediate dominator clock, derived clock> are analyzed during multitude of parallel process steps 412B through 412i, compiler 103 then also determines a result an associated table 2 for each different selected clock pair <immediate dominator clock signal clk 740, signal e> in accordance with the direction of the transition of clock signal clk 240 or immediate dominator clock signal clk 740 that clocks the sequential circuit that drives selected signal e, e.g. respectively one of sequential circuits 705, 710 through 715, or analogously, one of flip flop FDE 205, flip flop FD_1 210. The result will later be used to determine which one of two types of circuit transformation to do in accordance with whether the result is positive polarity or negative polarity for each different selected signal e.

If 425 the selected derived clock signal is not transformable, then compiler 103 selects 430 a new primary clock signal to analyze, which may not be applicable in the examples described above in reference to FIGS. 2A and 7. However in one example, if the selected portion of the clock tree associated with the selected <immediate dominator clock, derived clock> produces a CDG similar to first exemplary CDG 500 depicted in FIG. 5, and let both transition cases 801, 802 be satisfied for selected derived clock clk 5, then selected derived clock clk 5 is not transformable. In this example, derived clock clk 5 may be selected as a new primary clock and not be transformed as a derived clock. Then, first exemplary CDG 500 will be modified to disconnect edges 535, 545 that connect between clock clk 5 and clocks clk 3, clk 4 respectively.

It is understood that steps 415 through 435 described above are done in parallel for a multitude of clock pairs <immediate dominator clock, derived clock> that may be very large in number for a complex IC, which may result in the advantage of considerable savings of computational time by compiler 103. The following steps may be done on the entirety of the untransformed initial design 101 in transition to the transformed design as described below. Next, compiler 103 consolidates 440 the CDGs from all clock pairs <immediate dominator clock, derived clock> analyzed in parallel process steps, 412A, 412B through 412i. In one embodiment, each of the four transition cases 801, 802, 803, 804 may be considered for consolidation 440 of the CDGs.

Figure 10:
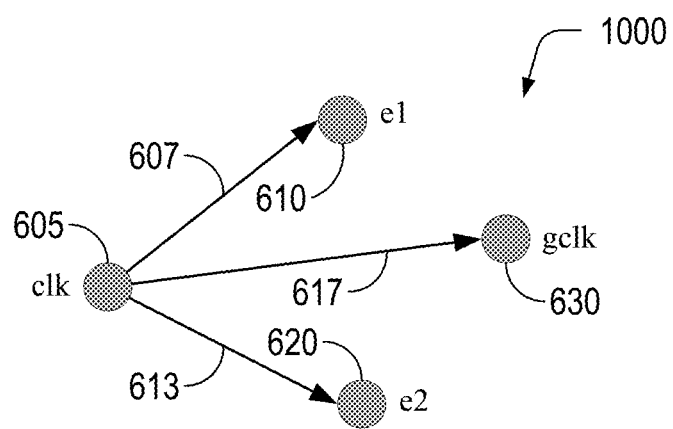
FIG. 10 depicts data representing an exemplary consolidated CDG associated with circuit portion 200B depicted in FIG. 2B after the CDG consolidation step depicted in FIG. 4, in accordance with one embodiment of the present invention.

FIG. 10 depicts data representing an exemplary consolidated CDG 1000 associated with circuit portion 200B depicted in FIG. 2B after CDG consolidation step 440 depicted in FIG. 4, in accordance with one embodiment of the present invention. Consolidated CDG 1000 includes the same elements and function as second exemplary CDG 600 depicted in FIG. 6 with the following exceptions. Consolidated CDG 1000 does not include edge 623 and edge 627, which are both eliminated in consolidated CDG 1000. Consolidated CDG 1000 may be characterized by table 3 below.

TABLE 3

| <immediate dominator clock, derived clock> | Satisfied transition cases |
|---|---|
| <clk, e$_1$> | Case 801, case 803 |
| <clk, e$_2$> | Case 802, case 804 |
| <clk, gclk> | Case 801, case 804 |

Referring simultaneously to FIGS. 2A, 2B, 4, and 8, further in step 440, compiler 103 annotates clocks and enables polarity as described in table 4 below, which is associated with the transformation of circuit portion 200A into circuit portion 200B. In table 4, Pos_FD refers to a flip-flop type FD that toggles when receiving a positive or rising transition at its CK input pin. Neg_FD refers to a flip-flop type FD_1 that toggles when receiving a negative or falling transition at its CK input pin. Clk refers to using the non-inverted clk signal to clock the flip-flop, while ~clk refers to using the inverted clk signal to clock the flip-flop. Next, compiler 103 transforms 445 connections and makes updates for the enable and clock networks as represented in table 4.

TABLE 4

|  | e$_1$ | e$_2$ | gclk |
|---|---|---|---|
| Pos_FD | clk | ~clk | clk |
| Neg_FD | ~clk | clk | clk |

Figure 11:
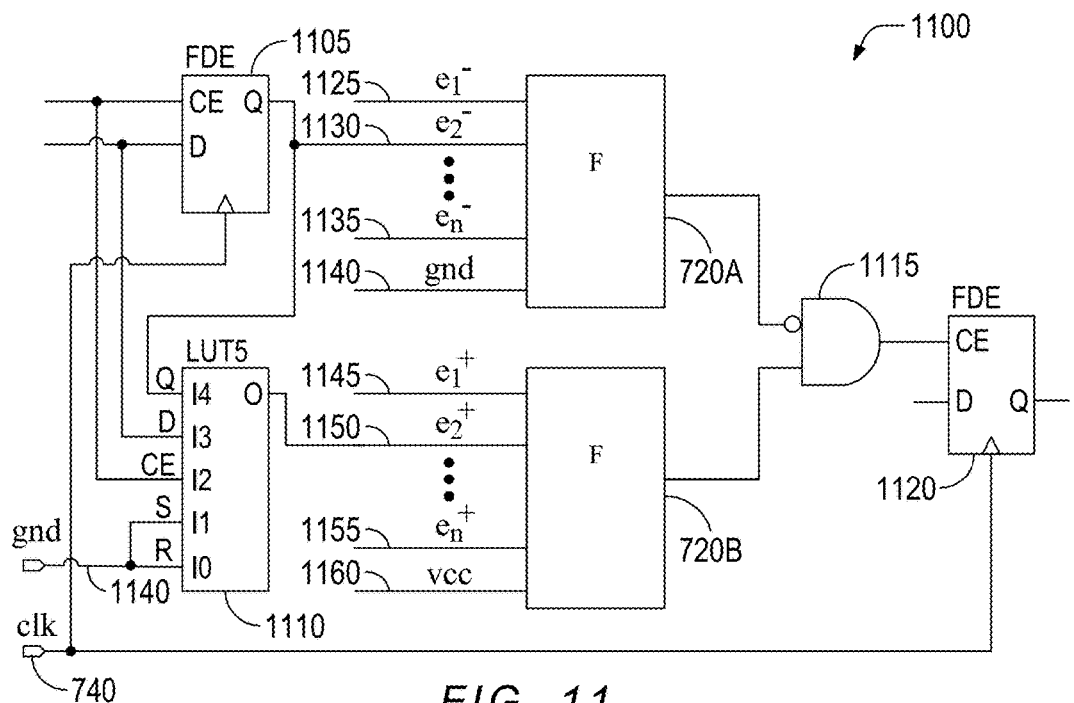
FIG. 11 depicts data representing an exemplary schematic of a generalized circuit transformation that may be used in the step to transform connections and networks depicted in FIG. 4 when the sequential circuit driving signal e depicted in FIG. 7 is clocked by a rising clock transition, in accordance with one embodiment of the present invention.

FIG. 11 depicts data representing an exemplary schematic of a generalized circuit transformation 1100 that may be used in the step to transform 445 connections and networks depicted in FIG. 4 when sequential circuit 710 driving signal e$_2$ depicted in FIG. 7 is clocked by a rising or positive clock transition, as described by the positive polarity result described in table 2, in accordance with one embodiment of the present invention. Referring simultaneously to FIGS. 4, 7, and 11, generalized circuit transformation 1100 may include a flip-flop FDE 1105, a look up table LUT5 1110, a pair of combinational circuit function F 720A, 720B, a logical "AND" gate 1115 including one inverting input and another non-inverting input, and a flip-flop FDE 1120.

Generalized derived clock function 700 may be transformed as follows. Recall, selected derived clock signal gclk 750 is transformable. Since first transition case 801 is positive polarity, compiler 103 assumes the positive or rising transition for immediate dominator clock signal clk 740 in the network analysis. Flip-flop FDE 1105 replaces sequential circuit 710. Flip-flop FDE 1105 includes the function of a new CE signal input during the analysis of another clock pair <immediate dominator clock X, "derived" clock signal clk 740> when immediate dominator clock signal clk 740 that drives sequential circuit 710 is instead considered as another derived clock signal, such that immediate dominator clock X may be connected to the new CE signal input of flip-flop FDE 1105 after transformation.

The Q output of flip-flop FDE 1105 drives signal e$_2^-$ 1130 and the I4 input of look up table LUT5 1110. Combinational circuit function F 720 is duplicated so that one combinational circuit function F 720A receives signals e$^-$ 1125-1135 and a ground gnd signal 1140 as inputs associated with the term F(0, e$_1^-$, e$_2^-$, e$_3^-$, . . . , e$_n^-$) in equation 4. The other combinational circuit function F 720B receives signals e$^+$ 1145-1155 and a logic "1" vcc signal 1160 as inputs associated with the term F(1, e$_1^+$, e$_2^+$, e$_3^+$, . . . , e$_n^+$) in equation 4.

Compiler 103 has determined in parallel that for clock pair <immediate dominator clock signal clk 740, signal e$_2$> associated table 2 indicates first transition case 801 and third transition case 803 are both SAT. Recall compiler 103 has assumed the positive or rising transition for immediate dominator clock signal clk 740 for the transformation, and since first transition case 801 is SAT, then e$_2^-$ and e$_2^+$ are not equal so a combinatorial circuit implemented in a look up table may be used in the transformation.

The D and CE inputs for flip-flop FDE 1105 respectively drive I3 and I2 inputs of look up table LUT5 1110. The S and R ports are assigned respectively to I1 and I0 inputs of look up table LUT5 1110, which are both connected to ground gnd 1140. In one embodiment, if immediate dominator clock signal clk 740 may not be transformable when considering <immediate dominator clock X, derived clock signal clk 740> (not depicted), then sequential circuit 710 may not be transformed from a flip-flop type FD into a flip-flop type FDE and the CE input pin of look up table LUT5 may instead be connected to logic "1" vcc signal 1160. In another embodiment, if sequential circuit 710 includes a R port and a S port driven by associated signals (not depicted), then the R and S ports of look up table LUT5 1110 are connected respectively to the R and S ports of look up table LUT5 1110 instead of connecting the R and S ports of look up table LUT5 1110 to ground gnd 1140.

Look up table LUT5 1110 is characterized by the following functionality which is also described in table 4;

$$O = CE ? (R ? 0:(S ? 1:D)):Q. \qquad \text{eq. 13}$$

TABLE 4

| I4(Q) | I3(D) | I2(CE) | I1(S) | I0(R) | O |
|---|---|---|---|---|---|
| 0 | 0 | 0 | 0 | 0 | 0 |
| 0 | 0 | 0 | 0 | 1 | 0 |
| 0 | 0 | 0 | 1 | 0 | 0 |
| 0 | 0 | 0 | 1 | 1 | 0 |
| 0 | 0 | 1 | 0 | 0 | 0 |
| 0 | 0 | 1 | 0 | 1 | 0 |
| 0 | 0 | 1 | 1 | 0 | 1 |
| 0 | 0 | 1 | 1 | 1 | 0 |
| 0 | 1 | 0 | 0 | 0 | 0 |
| 0 | 1 | 0 | 0 | 1 | 0 |
| 0 | 1 | 0 | 1 | 0 | 0 |
| 0 | 1 | 0 | 1 | 1 | 0 |
| 0 | 1 | 1 | 0 | 0 | 1 |
| 0 | 1 | 1 | 0 | 1 | 0 |
| 0 | 1 | 1 | 1 | 0 | 1 |
| 0 | 1 | 1 | 1 | 1 | 0 |
| 1 | 0 | 0 | 0 | 0 | 1 |
| 1 | 0 | 0 | 0 | 1 | 1 |
| 1 | 0 | 0 | 1 | 0 | 1 |
| 1 | 0 | 0 | 1 | 1 | 1 |
| 1 | 0 | 1 | 0 | 0 | 0 |
| 1 | 0 | 1 | 0 | 1 | 0 |
| 1 | 0 | 1 | 1 | 0 | 1 |
| 1 | 0 | 1 | 1 | 1 | 0 |
| 1 | 1 | 0 | 0 | 0 | 1 |
| 1 | 1 | 0 | 0 | 1 | 1 |
| 1 | 1 | 0 | 1 | 0 | 1 |
| 1 | 1 | 0 | 1 | 1 | 1 |
| 1 | 1 | 1 | 0 | 0 | 1 |
| 1 | 1 | 1 | 0 | 1 | 0 |
| 1 | 1 | 1 | 1 | 0 | 1 |
| 1 | 1 | 1 | 1 | 1 | 0 |

The output of look up table LUT5 1110 drives signal e$_2^+$ 1150. The output of combinational circuit function F 720A drives the inverting input of logical "AND" gate 1115. The output of combinational circuit function F 720B drives the non-inverting input of logical "AND" gate 1115. Sequential circuit 745 is replaced by flip-flop FDE 1120. The output of logical "AND" gate 1115 drives a CE input of flip-flop FDE 1120, which is clocked by the rising transition of immediate dominator clock signal clk 740, which succeeds in eliminating derived clock signal gclk 750 as desired, at least for the logic associated for signal $e_2$. The transformation considers the rest of the multitude of signals e repeating the generalized circuit transformation 1100 for any other signals e driven by sequential circuits that are clocked using a positive or rising transition of immediate dominator clock signal clk 740.

Figure 12:
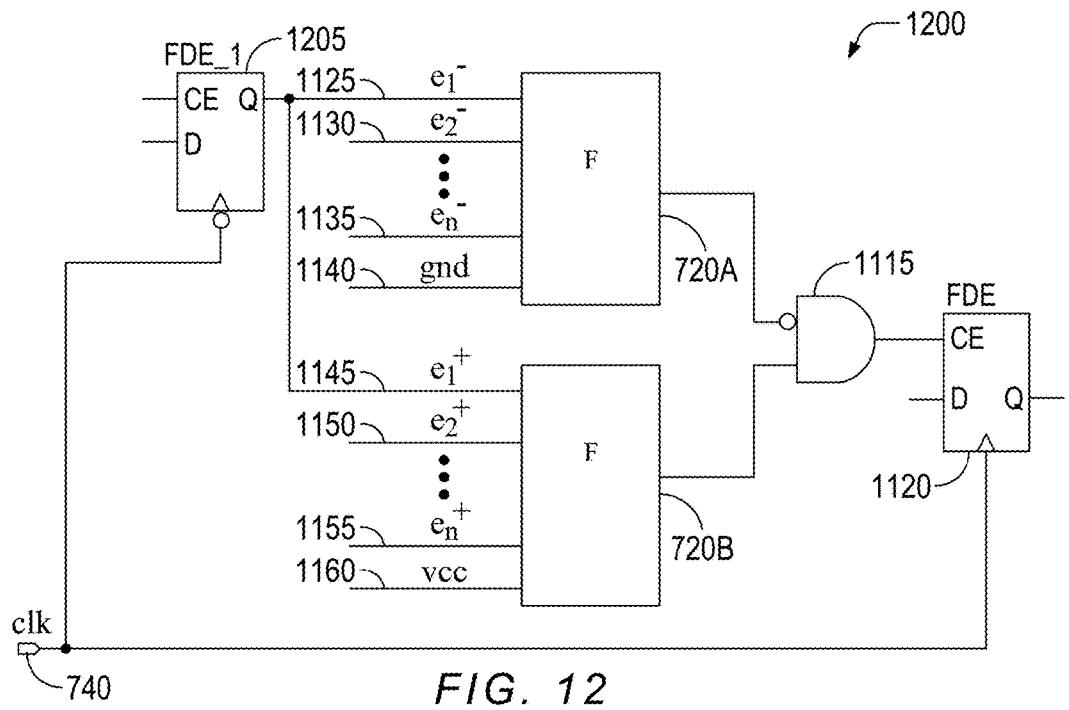
FIG. 12 depicts data representing an exemplary schematic of a generalized circuit transformation that may be used in the step to transform connections and networks depicted in FIG. 4 when the sequential circuit driving signal e depicted in FIG. 7 is clocked by a falling clock transition, in accordance with one embodiment of the present invention.

FIG. 12 depicts data representing an exemplary schematic of a generalized circuit transformation 1200 that may be used in the step to transform 445 connections and networks depicted in FIG. 4 when sequential circuit 705 driving signal $e_1$ depicted in FIG. 7 is clocked by a falling or negative clock transition, as described by the negative polarity result described in table 2, in accordance with one embodiment of the present invention. Referring simultaneously to FIGS. 4, 7, 11, and 12, generalized circuit transformation 1200 may include the same elements and function as generalized circuit transformation 1200 depicted in FIG. 11 with the following exceptions. Sequential circuit 705 is replaced by flip-flop FDE_1 1205, which is also clocked by a falling or negative clock transition and whose Q output drives both signal $e_1^-$ 1125 and signal $e_1^+$ 1145.

Compiler 103 has determined in parallel that for clock pair <immediate dominator clock signal clk 740, signal $e_1$> associated table 2 indicates second transition case 802 and fourth transition case 804 are both UNSAT. Associated table 2 further indicates first transition case 801 and third transition case 803 are both SAT. Recall compiler 103 has assumed the positive or rising transition for immediate dominator clock signal clk 740 for the transformation. Since a positive or rising transition for immediate dominator clock signal clk 740 does not result in a change for $e_1$, then $e_1^-$ and $e_1^+$ are equal so there is no need for a combinatorial circuit implemented in a look up table in the transformation. Similarly, there is no look up table LUT5 1110 used when repeating the generalized circuit transformation 1200 for any other selected clock pairs <immediate dominator clock signal clk 740, signal e> when signals e are driven by sequential circuits that are clocked using a negative or falling transition of immediate dominator clock signal clk 740, because in these examples $e^-=e^+$.

For constraints outside the clock cone it is noted that adding more constraints will turn a satisfiable problem into unsatisfiable, but not vice versa. Hence the embodiments described above are conservative, because satisfiable results tend to block the optimization. Hence more constraints, which make the satisfiable problem harder, may lead to more optimization.

Recall, multitude of parallel process steps, 412A, 412B through 412i in FIG. 4 may be executed in parallel for each different clock pair <immediate dominator clock, derived clock> in the initial design, e.g. circuit portion 200A or generalized derived clock function 700. Accordingly for circuit portion 200A, clock pairs <clock signal clk 240, signal $e_1$ 225> and <clock signal clk 240, signal $e_2$ 230> may be analyzed in parallel besides clock pair <clock signal clk 240, derived clock signal gclk 250>—each clock pair having different associated multitude of tables 1-4 being generated in analogous fashion as described above.

Similarly for generalized derived clock function 700, clock pairs <immediate dominator clock signal clk 740, output signal $e_1$ 725>, <immediate dominator clock signal clk 740, output signal $e_2$ 730>, and <immediate dominator clock signal clk 740, output signal $e_n$ 735> may be analyzed in parallel besides clock pair <immediate dominator clock signal clk 740, derived clock signal gclk 750>—each clock pair having a different associated multitude of tables 1-4 being generated in analogous fashion as described above.

Further, compiler 103 determines which of the transformations described in reference to FIG. 11, i.e. using a LUT for positive polarity, or FIG. 12, i.e. not using a LUT for negative polarity, that may be utilized in accordance with the results of the multitude of table 2 that are generated for each different associated clock pair <immediate dominator clock, derived clock>. Accordingly, the polarities of all sequential circuit clock inputs and clock transitions are properly analyzed by compiler 103 prior to transformation.

Figure 13:
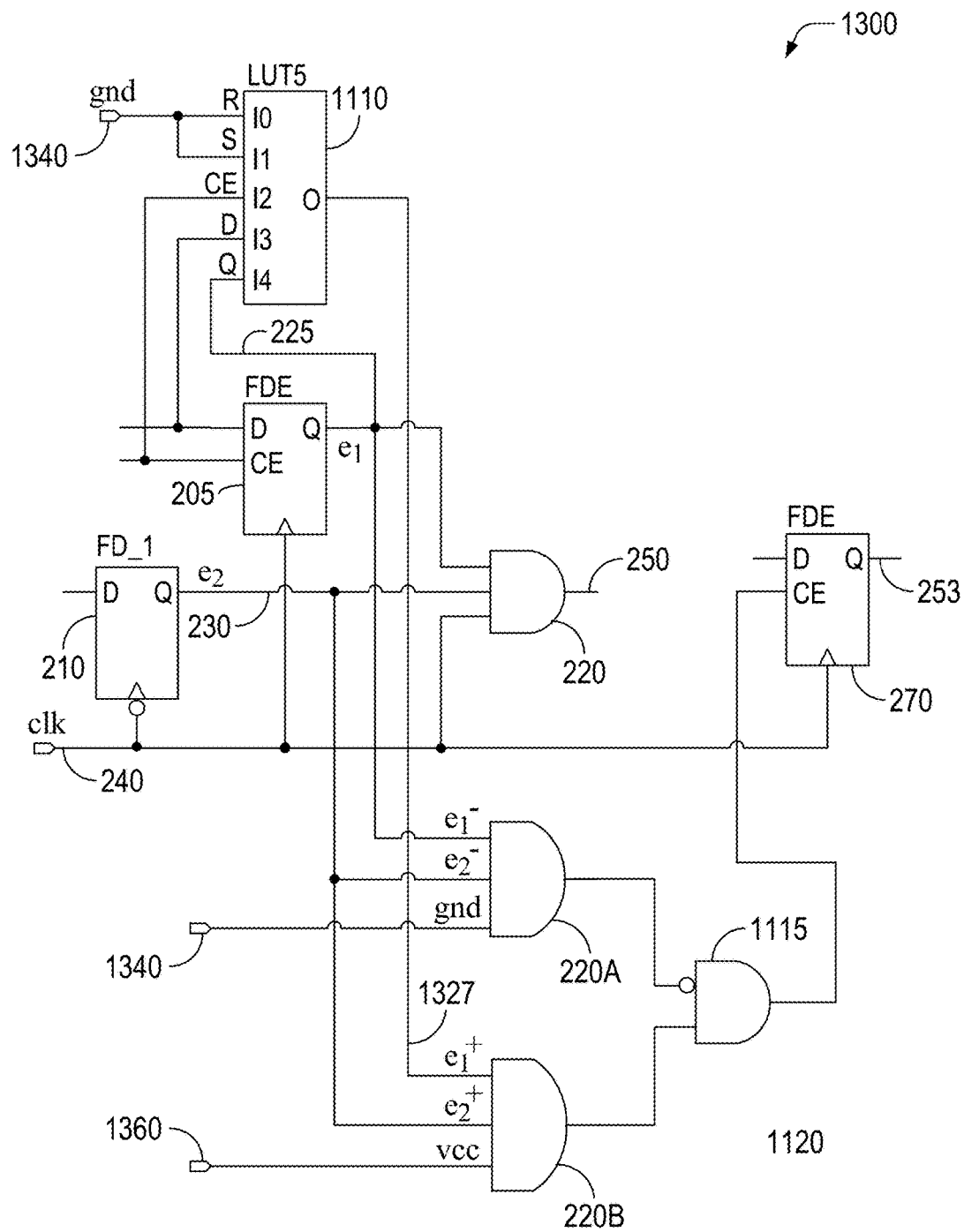
FIG. 13 depicts data representing an exemplary schematic of a transformed circuit portion 1300 after the step to transform 445 connections and networks depicted in FIG. 4 and associated with circuit portion 200A depicted in FIG. 2A, in accordance with one embodiment of the present invention.

FIG. 13 depicts data representing an exemplary schematic of a transformed circuit portion 1300 after the step to transform 445 connections and networks depicted in FIG. 4 and associated with circuit portion 200A depicted in FIG. 2A, in accordance with one embodiment of the present invention. Referring simultaneously to FIGS. 2A-2B, 11, 12, and 13, circuit portion 1300 includes the same elements and function of circuit portion 200A of initial design 101 with the following exceptions. Recall, it is desired to eliminate the derived clock signal, derived clock signal gclk 250, which is now disconnected from the clock input of flip flop FD 245 and left floating for the time being until a later step described below.

Transformed circuit portion 1300 includes a look up table LUT5 1110, a flip flop FDE 270, and pair of logical "AND" gates 220A, 220B. The transformation includes replacing flip flop FD 245 with a flip flop FDE 270 analogous to flip-flop FDE 1120 as described above. For the reasons described earlier, the transformation duplicates the combinational circuit function F, represented in this example by logical "AND" gate 220, into the additional pair of logical "AND" gates 220A, 220B, that are analogous to the pair of combinational circuit function F 720A, 720B described above. Transformed circuit portion 1300 further includes a logical "AND" gate 1115

Following the transformation procedure described above for the positive polarity result of table 2, the transformation further includes connecting signal $e_1$ 225 from the Q output of flip flop FDE 205 to an I4 input of look up table LUT5 1110 and to a signal $e_1^-$ that is one input of logical "AND" gate 220A. Another input of logical "AND" gate 220A is connected to ground gnd 1340. The transformation further includes connecting the D and CE signal inputs of flip flop FDE 205 to respective I3 and I2 inputs of look up table LUT5 1110. The S and R ports are assigned respectively to I1 and I0 inputs of look up table LUT5 1110, which are both connected to ground gnd 1340. An output O of look up table LUT5 1110 drives a signal $e_1^+$ 1327, which in-turn drives one input of logical "AND" gate 220B. The functionality of look up table LUT5 1110 was described above. Another input of logical "AND" gate 220B is connected to logic "1" vcc 1360.

Following the transformation procedure described above for the negative polarity result of table 2, the transformation further includes connecting signal $e_2$ 230 from the Q output of flip flop FD_1 210 to one input of logical "AND" gate 220A as a signal $e_2^-$ and to one input of logical "AND" gate 220B as a signal $e_2^+$. The output of logical "AND" gate 220A drives an inverting input of logical "AND" gate 1115, while the output of logical "AND" gate 220B drives a non-inverting input of logical "AND" gate 1115. The output of logical "AND" gate 1115 drives the CE input of flip flop FDE 270, whose other connections and functions have been already described above.

Referring again to FIGS. 2B, 4, and 13, compiler 103 next performs logic optimization 450 and technology mapping to simplify logic circuits generated earlier. For example, look up table LUT5 1110 may be simplified to a look up table LUT3 260 because the R and S inputs of look up table LUT 5 1110 are connected to logic "0" or ground gnd 1340. Further logic optimization is done to simplify logical "AND" gates 220, 220A, 220B, and 1115, which results with the only one logical "AND" gate 220 as depicted in FIG. 2B, which completes the step of transformation 315 described in reference to FIGS. 3 and 4.

Referring again to FIGS. 1, 2B, and 3, the netlist of mapped data represented in-part by schematic portion 200B is compiled 320 to generate a binary image compatible with hardware of emulator or prototype system 102. Then FPGA 104 units may be programmed or configured 325 with the binary image corresponding to the mapped data represented in-part by schematic portion 200B and including the functionality of initial design 101. Hardware emulator or prototype system 102 may then be run 330 to verify the initial design 101 at higher speed than is possible using previous emulator or prototype system approaches that fail to use the low slew interconnection resources in emulator or prototype system 102 as efficiently as when using the embodiments described herein.

Figure 14:
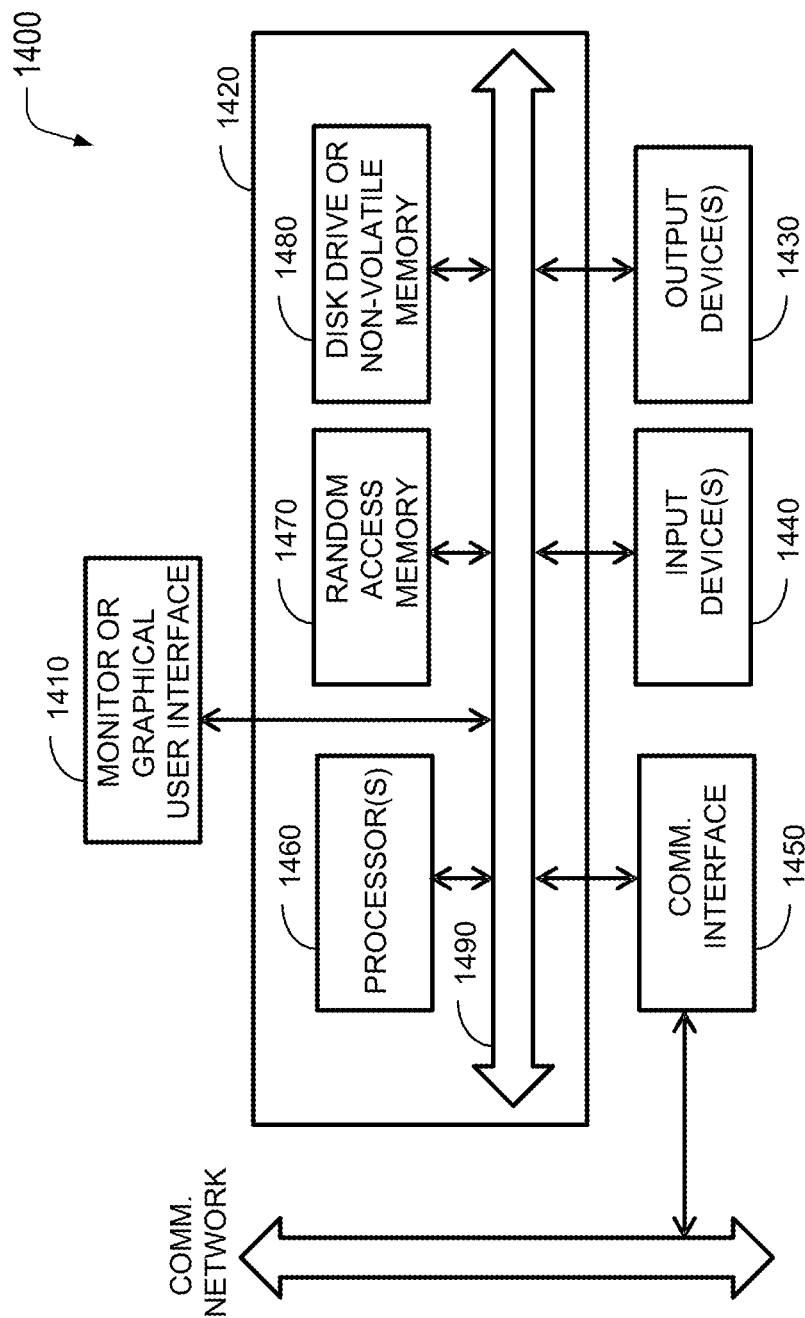
FIG. 14 depicts an example block diagram of a computer system that may incorporate embodiments of the present invention.

FIG. 14 is an example block diagram of a computer system 1400 that may incorporate embodiments of the present invention. FIG. 14 is merely illustrative of an embodiment incorporating the present invention and does not limit the scope of the invention as recited in the claims. One of ordinary skill in the art would recognize other variations, modifications, and alternatives. In one embodiment, computer system 1400 typically includes a monitor 1410, a computer 1420, user output devices 1430, user input devices 1440, communications interface 1450, and the like.

As depicted in FIG. 14, computer 1420 may include a processor(s) 1460 that communicates with a number of peripheral devices via a bus subsystem 1490. These peripheral devices may include user output devices 1430, user input devices 1440, communications interface 1450, and a storage subsystem, such as random access memory (RAM) 1470 and disk drive 1480.

User input devices 1440 include all possible types of devices and mechanisms for inputting information to computer 1420. These may include a keyboard, a keypad, a touch screen incorporated into the display, audio input devices such as voice recognition systems, microphones, and other types of input devices. In various embodiments, user input devices 1430 are typically embodied as a computer mouse, a trackball, a track pad, a joystick, wireless remote, drawing tablet, voice command system, eye tracking system, and the like. User input devices 1440 typically allow a user to select objects, icons, text and the like that appear on the monitor 1410 via a command such as a click of a button or the like.

User output devices 1440 include all possible types of devices and mechanisms for outputting information from computer 1420. These may include a display (e.g., monitor 1410), non-visual displays such as audio output devices, etc.

Communications interface 1450 provides an interface to other communication networks and devices. Communications interface 1450 may serve as an interface for receiving data from and transmitting data to other systems. Embodiments of communications interface 1450 typically include an Ethernet card, a modem (telephone, satellite, cable, ISDN), (asynchronous) digital subscriber line (DSL) unit, FireWire interface, USB interface, and the like. For example, communications interface 1450 may be coupled to a computer network, to a FireWire bus, or the like. In other embodiments, communications interfaces 1450 may be physically integrated on the motherboard of computer 1420, and may be a software program, such as soft DSL, or the like.

In various embodiments, computer system 1400 may also include software that enables communications over a network such as the HTTP, TCP/IP, RTP/RTSP protocols, and the like. In alternative embodiments of the present invention, other communications software and transfer protocols may also be used, for example IPX, UDP or the like. In some embodiments, computer 1420 includes one or more Xeon microprocessors from Intel as processor(s) 1460. Further, one embodiment, computer 1420 includes a UNIX-based operating system.

RAM 1470 and disk drive 1480 are examples of tangible media configured to store data such as embodiments of the present invention, including executable computer code, human readable code, or the like. Other types of tangible media include floppy disks, removable hard disks, optical storage media such as CD-ROMS, DVDs and bar codes, semiconductor memories such as flash memories, non-transitory read-only-memories (ROMS), battery-backed volatile memories, networked storage devices, and the like. RAM 1470 and disk drive 1480 may be configured to store the basic programming and data constructs that provide the functionality of the present invention.

Software code modules and instructions that provide the functionality of the present invention may be stored in RAM 1470 and disk drive 1480. These software modules may be executed by processor(s) 1460. RAM 1470 and disk drive 1480 may also provide a repository for storing data used in accordance with the present invention.

RAM 1470 and disk drive 1480 may include a number of memories including a main random access memory (RAM) for storage of instructions and data during program execution and a read only memory (ROM) in which fixed non-transitory instructions are stored. RAM 1470 and disk drive 1480 may include a file storage subsystem providing persistent (non-volatile) storage for program and data files. RAM 1470 and disk drive 1480 may also include removable storage systems, such as removable flash memory.

Bus subsystem 1490 provides a mechanism for letting the various components and subsystems of computer 1420 communicate with each other as intended. Although bus subsystem 1490 is depicted schematically as a single bus, alternative embodiments of the bus subsystem may utilize multiple busses.

FIG. 14 is representative of a computer system capable of embodying the present invention. It will be readily apparent to one of ordinary skill in the art that many other hardware and software configurations are suitable for use with the present invention. For example, the computer may be a desktop, portable, rack-mounted or tablet configuration. Additionally, the computer may be a series of networked computers. Further, the use of other microprocessors are contemplated, such as Pentium™ or Itanium™ microprocessors; Opteron™ or AthlonXP™ microprocessors from Advanced Micro Devices, Inc; and the like. Further, other types of operating systems are contemplated, such as Windows®, WindowsXP®, WindowsNT®, or the like from Microsoft Corporation, Solaris from Sun Microsystems, LINUX, UNIX, and the like. In still other embodiments, the techniques described above may be implemented upon a chip or an auxiliary processing board.

Various embodiments of the present invention can be implemented in the form of logic in software or hardware or a combination of both. The logic may be stored in a computer readable or machine-readable non-transitory storage medium as a set of instructions adapted to direct a processor of a computer system to perform a set of steps disclosed in embodiments of the present invention. The logic may form part of a computer program product adapted to direct an information-processing device to perform a set of steps disclosed in embodiments of the present invention. Based on the disclosure and teachings provided herein, a person of ordinary skill in the art will appreciate other ways and/or methods to implement the present invention.

The data structures and code described herein may be partially or fully stored on a computer-readable storage medium and/or a hardware module and/or hardware apparatus. A computer-readable storage medium includes, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Hardware modules or apparatuses described herein include, but are not limited to, application-specific integrated circuits (ASICs), field-programmable gate arrays (FPGAs), dedicated or shared processors, and/or other hardware modules or apparatuses now known or later developed.

The methods and processes described herein may be partially or fully embodied as code and/or data stored in a computer-readable storage medium or device, so that when a computer system reads and executes the code and/or data, the computer system performs the associated methods and processes. The methods and processes may also be partially or fully embodied in hardware modules or apparatuses, so that when the hardware modules or apparatuses are activated, they perform the associated methods and processes. The methods and processes disclosed herein may be embodied using a combination of code, data, and hardware modules or apparatuses.

The above descriptions of embodiments of the present invention are illustrative and not limitative. In addition, similar principles as described corresponding to latches and/or flops can be applied to other sequential logic circuit elements. Other modifications and variations will be apparent to those skilled in the art and are intended to fall within the scope of the appended claims.

What is claimed is:

1. A computer-implemented method for configuring a hardware verification system, the method comprising:
    receiving, by the computer, a first data representative of a first design of an integrated circuit configured to operate by a first clock signal derived from a second clock signal and a third signal generated in accordance with the second clock signal, when the computer is invoked to configure the verification system; and
    transforming, using the computer, the first data into a second data representative of a second design that includes functionality of the first design, wherein said transformation replaces the first clock signal with the second clock signal in accordance with:
        a first Boolean function defined by first and second values of the third signal corresponding to a first transition of the second clock signal being in a same direction as an associated transition of the first clock signal;
        a second Boolean function defined by the first and second values of the third signal corresponding to a second transition of the second clock signal being in a direction opposite to that of the associated transition of the first clock signal;
        a constraint defining the first and second values of the third signal; and
        a Boolean satisfiability of the first and second Boolean functions.

2. The computer-implemented method of claim 1, wherein the first Boolean function is further defined in the first design by:
    the first transition of the second clock signal characterized by a first direction;
    the associated transition of the first clock signal characterized by the first direction;
    the first value of the third signal defined before the first transition of the second clock signal; and
    the second value of the third signal defined after the first transition of the second clock signal.

3. The computer-implemented method of claim 1, wherein the second Boolean function is further defined in the first design by:
    the second transition of the second clock signal characterized by a first direction;
    the associated transition of the first clock signal characterized by a second direction different from the first direction;
    the first value of the third signal defined before the first transition of the second clock signal; and
    the second value of the third signal defined after the first transition of the second clock signal.

4. The computer-implemented method of claim 1, wherein the Boolean satisfiability further includes determining that the first Boolean function is satisfiable and the second Boolean function is unsatisfiable.

5. The computer-implemented method of claim 1, wherein the Boolean satisfiability further includes determining that the first Boolean function is unsatisfiable and the second Boolean function is satisfiable.

6. The computer-implemented method of claim 1, wherein the first design further includes a first sequential element configured to be clocked in accordance with the first signal, said first signal being derived from the second signal and the third signal, said third signal generated by a second sequential element configured to be clocked in accordance with the second signal.

7. The computer-implemented method of claim 1, wherein the transformation further comprises replacing a first sequential element configured to be clocked in accordance with the first signal in the first design with a second sequential element configured in the second design to be:
    clocked in accordance with a rising transition of the second clock signal; and
    enabled in accordance with a combinatorial circuit that implements the first Boolean function after determining that the first Boolean function is satisfiable and the second Boolean function is unsatisfiable.

8. The computer-implemented method of claim 7, wherein the second sequential element is further configured in the second design to be enabled in accordance with a combinatorial circuit that implements the first Boolean function after determining that the first Boolean function is unsatisfiable and the second Boolean function is satisfiable.

9. The computer-implemented method of claim 7, wherein the second sequential element is a flip-flop, wherein the transforming further includes:

coupling the second signal to a clock input terminal of the flip-flop; and coupling an output of the combinatorial circuit to an enable input terminal of the flip-flop.

10. The computer-implemented method of claim 1, wherein the transformation further comprises replacing a first sequential element configured to be clocked in accordance with the first signal in the first design with a second sequential element configured in the second design to be:

clocked in accordance with a rising transition of the second clock signal; and enabled in accordance with a combinatorial circuit that implements the second Boolean function after determining that the first Boolean function is unsatisfiable and the second Boolean function is satisfiable.

11. A system for configuring a hardware verification system, the system configured to:

receive a first data representative of a first design of an integrated circuit configured to operate by a first clock signal derived from a second clock signal and a third signal generated in accordance with the second signal, when the computer is invoked to configure the verification system; and transform the first data into a second data representative of a second design that includes functionality of the first design, wherein said transformation replaces the first signal with the second signal in accordance with:

a first Boolean function defined by first and second values of the third signal corresponding to a first transition of the second clock signal being in a same direction as an associated transition of the first clock signal;

a second Boolean function defined by the first and second values of the third signal corresponding to a transition of the second clock signal being in a direction opposite to that of an associated transition of the first clock signal;

a constraint defining the first and second values of the third signal; and a Boolean satisfiability of the first and second Boolean functions.

12. The system of claim 11, wherein the first Boolean function is further defined in the first design by:

the first transition of the second clock signal characterized by a first direction;

the associated transition of the first clock signal characterized by the first direction;

the first value of the third signal defined before the first transition of the second clock signal; and the second value of the third signal defined after the first transition of the second clock signal.

13. The system of claim 11, wherein the second Boolean function is further defined in the first design by:

the second transition of the second clock signal characterized by a first direction;

the associated transition of the first clock signal characterized by a second direction different from the first direction;

the first value of the third signal defined before the first transition of the second clock signal; and the second value of the third signal defined after the first transition of the second clock signal.

14. The system of claim 11, wherein the Boolean satisfiability further includes determining that the first Boolean function is satisfiable and the second Boolean function is unsatisfiable.

15. The system of claim 11, wherein the Boolean satisfiability further includes determining that the first Boolean function is unsatisfiable and the second Boolean function is satisfiable.

16. The system of claim 11, wherein the first design further includes a first sequential element configured to be clocked in accordance with the first signal, said first signal being derived from the second signal and the third signal, said third signal generated by a second sequential element configured to be clocked in accordance with the second signal.

17. The system of claim 11, wherein the transformation is further configured to replace a first sequential element configured to be clocked in accordance with the first signal in the first design with a second sequential element configured in the second design to be:

clocked in accordance with a rising transition of the second clock signal; and enabled in accordance with a combinatorial circuit that implements the first Boolean function after determining that the first Boolean function is satisfiable and the second Boolean function is unsatisfiable.

18. The system of claim 17, wherein the second sequential element is further configured in the second design to be enabled in accordance with a combinatorial circuit that implements the first Boolean function after determining that the first Boolean function is unsatisfiable and the second Boolean function is satisfiable.

19. The system of claim 17, wherein the second sequential element is a flip-flop, wherein the transformation is further configured to:

couple the second signal to a clock input terminal of the flip-flop; and couple an output of the combinatorial circuit to an enable input terminal of the flip-flop.

20. The system claim 11, wherein the transformation is further configured to replace a first sequential element configured to be clocked in accordance with the first signal in the first design with a second sequential element configured in the second design to be:

clocked in accordance with a rising transition of the second clock signal; and enabled in accordance with a combinatorial circuit that implements the second Boolean function after determining that the first Boolean function is unsatisfiable and the second Boolean function is satisfiable.

* * * * *